(12) United States Patent
Kobayashi et al.

(10) Patent No.: US 12,352,856 B2
(45) Date of Patent: Jul. 8, 2025

(54) ULTRASONIC SENSOR

(71) Applicant: DENSO CORPORATION, Kariya (JP)

(72) Inventors: Kensuke Kobayashi, Nisshin (JP); Masayoshi Satake, Nisshin (JP); Dai Kondou, Kariya (JP)

(73) Assignee: DENSO CORPORATION, Kariya (JP)

( * ) Notice: Subject to any disclaimer, the term of this patent is extended or adjusted under 35 U.S.C. 154(b) by 640 days.

(21) Appl. No.: 17/653,093

(22) Filed: Mar. 1, 2022

(65) Prior Publication Data
US 2022/0191623 A1 Jun. 16, 2022

Related U.S. Application Data

(63) Continuation of application No. PCT/JP2020/033097, filed on Sep. 1, 2020.

(30) Foreign Application Priority Data

Sep. 3, 2019 (JP) ................. 2019-160632

(51) Int. Cl.
*G01N 27/22* (2006.01)
*G01L 1/16* (2006.01)
(Continued)

(52) U.S. Cl.
CPC ............ *G01S 15/931* (2013.01); *G01L 1/162* (2013.01); *G01S 7/52004* (2013.01); *G01S 7/521* (2013.01);
(Continued)

(58) Field of Classification Search
CPC ... H10N 30/302; G01S 7/52004; G01S 7/521; G01S 2007/52009; G01S 15/931; G01S 2015/938; H04R 17/025; G01L 1/162
(Continued)

(56) References Cited

U.S. PATENT DOCUMENTS 8,675,449 B2 3/2014 Mielenz
11,059,457 B1 * 7/2021 Rivera .................. G01S 17/931
(Continued)

FOREIGN PATENT DOCUMENTS

GB 2479981 A * 11/2011 ......... G01S 7/52004
WO WO-2019087966 A1 * 5/2019 ........... B06B 1/0607

OTHER PUBLICATIONS

Translation of WO 2019/087966 A1 (Year: 2019).*

*Primary Examiner* — Jamel E Williams
*Assistant Examiner* — Alex T Devito
(74) *Attorney, Agent, or Firm* — Maschoff Brennan

(57) ABSTRACT

An ultrasonic sensor includes an adhesion sensor detecting adhesion of a foreign substance to a first surface of a bottom of a microphone housing. The adhesion sensor includes: a plurality of variable capacitances defined between a plurality of sensor electrodes disposed on the first surface of the bottom, each of the variable capacitances having a capacitance value which changes in response to adhesion of a foreign substance to the first surface; and an adhesion detection unit configured to measure an individual capacitance value which is a capacitance value of each of the variable capacitances and a total capacitance value which is a total of capacitance values of all the variable capacitances to determine, based on the individual capacitance value and the total capacitance value, whether a foreign substance adheres to the first surface, and, when it is determined that a foreign substance adheres, specify a type of the foreign substance.

12 Claims, 12 Drawing Sheets

(51) Int. Cl.
  *G01S 7/52* (2006.01)
  *G01S 7/521* (2006.01)
  *G01S 15/931* (2020.01)
  *H04R 17/02* (2006.01)
  *H10N 30/30* (2023.01)

(52) U.S. Cl.
  CPC ......... *H04R 17/025* (2013.01); *H10N 30/302* (2023.02); *G01S 2007/52009* (2013.01); *G01S 2015/938* (2013.01)

(58) Field of Classification Search
  USPC .......................................................... 73/632
  See application file for complete search history.

(56) References Cited

U.S. PATENT DOCUMENTS

| | | | | |
|---|---|---|---|---|
| 11,635,504 B2* | 4/2023 | Koyama | ............... | B06B 1/0662 |
| | | | | 367/140 |
| 12,038,541 B2* | 7/2024 | Kobayashi | ............ | G01S 15/931 |
| 2005/0217375 A1* | 10/2005 | Mase | ................. | G01C 19/5719 |
| | | | | 73/504.12 |
| 2021/0405171 A1* | 12/2021 | Kobayashi | .............. | G01S 7/521 |

* cited by examiner

ULTRASONIC SENSOR

CROSS-REFERENCE TO RELATED APPLICATION

The present application is a continuation application of International Application No. PCT/JP2020/033097, filed Sep. 1, 2020, which claims priority to Japanese Patent Application No. 2019-160632 filed Sep. 3, 2019. The contents of these applications are incorporated herein by reference in their entirety.

BACKGROUND

Technical Field of the Invention

The present disclosure relates to an ultrasonic sensor having a microphone housing that performs ultrasonic vibration.

Background Art

An ultrasonic sensor is configured to be mounted on a body part such as a bumper of a vehicle, and has a configuration in which a microphone is bonded to a bottom (hereinafter, referred to as a vibration portion) of a microphone housing which is comprised of a member formed in a bottomed cylinder shape. The ultrasonic sensor generates ultrasonic waves by causing the vibration portion to be subjected to ultrasonic vibration when the microphone is energized, and receives reflected waves of the ultrasonic waves to thereby detect an obstacle located in the vicinity of the vehicle. When an adhering substance adheres to a vibration surface of the microphone housing of the ultrasonic sensor, the vibration properties change due to the adhesion, which hinders accurate obstacle detection. Specifically, when snow adheres to an entire surface of the vibration portion, the ultrasonic waves are absorbed by the adhering substance, leading to a failure in obstacle detection.

SUMMARY

In the present disclosure, provided is an ultrasonic sensor as the following.

The ultrasonic sensor includes an adhesion sensor detecting adhesion of a foreign substance to a first surface of a bottom of a microphone housing. The adhesion sensor includes: a plurality of variable capacitances defined between a plurality of sensor electrodes disposed on the first surface of the bottom, each of the plurality of variable capacitances having a capacitance value which changes in response to adhesion of a foreign substance to the first surface; and an adhesion detection unit configured to measure an individual capacitance value which is a capacitance value of each of the plurality of variable capacitances and a total capacitance value which is a total of the capacitance values of all the plurality of variable capacitances to determine, based on the individual capacitance value and the total capacitance value, whether a foreign substance adheres to the first surface, and, when it is determined that a foreign substance adheres, specify a type of the foreign substance.

DETAILED DESCRIPTION OF THE PREFERRED EMBODIMENTS

Figure 1:
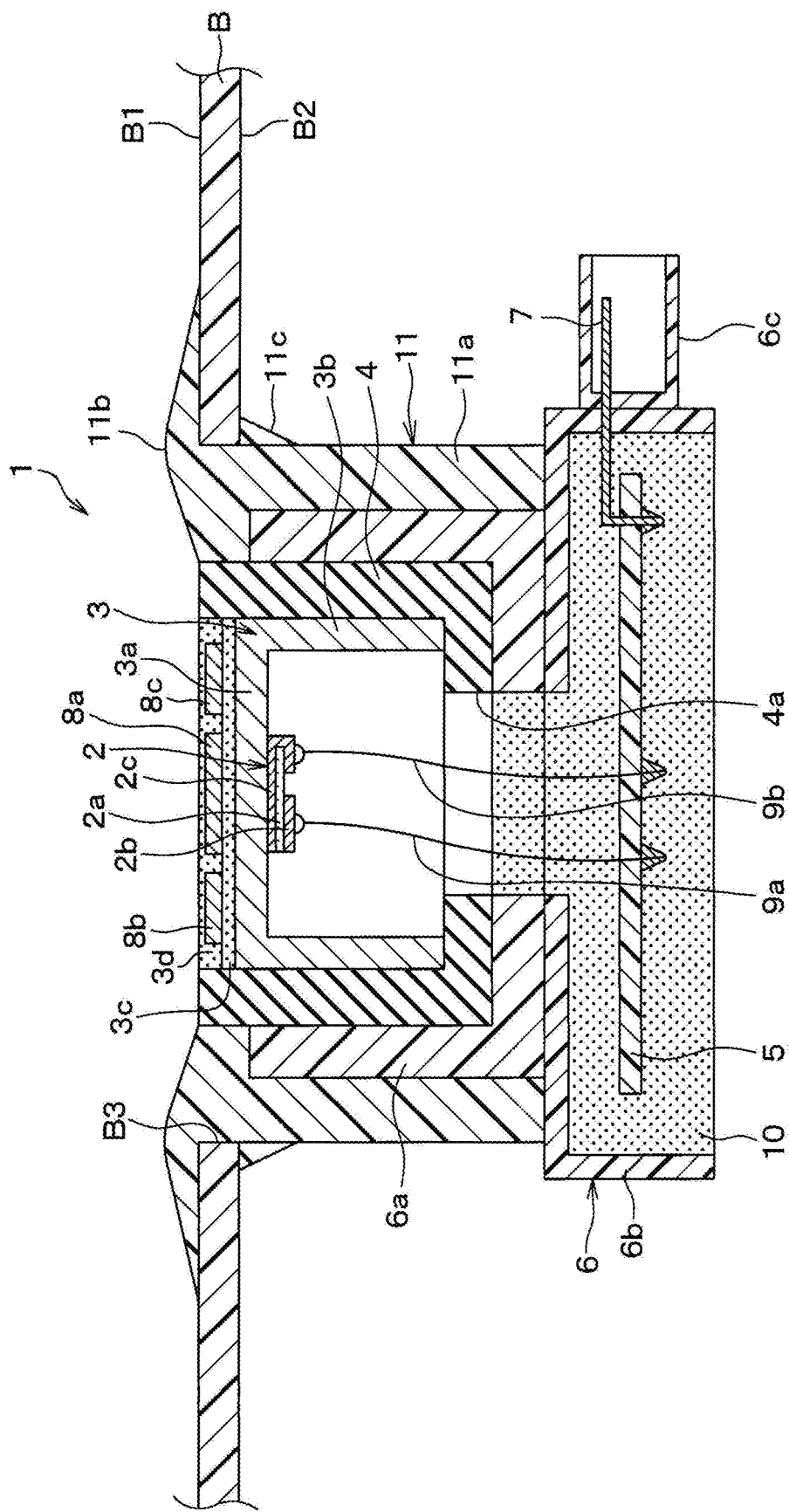
FIG. 1 is a cross-sectional view of an ultrasonic sensor according to a first embodiment.

PTL 1 discloses a technique in which two annular electrodes are concentrically arranged on a vibration surface of the microphone housing. When a capacitance between the two annular electrodes changes due to adhering substance, the adhering substance is detected based on the change in capacitance.

[PTL 1] U.S. Pat. No. 8,675,449 B

However, while adhesion of a foreign substance to the entire surface of the vibration portion has a large influence on obstacle detection, partial adhesion of a foreign substance such as water to the vibration surface has a smaller influence. Although it is desired to differentiate between partial adhesion and entire adhesion of a foreign substance in detection of foreign substance adhesion, such differentiation is difficult. That is, the capacitance varies with the relative dielectric constant and the adhesion area of adhering substance. Since the relative dielectric constants of snow and water are 3 and 80, respectively, a difference in capacitance between partial adhesion of water and entire adhesion of snow is not clear, and it is difficult to determine whether the adhesion is partial adhesion of water or entire adhesion of snow.

It is thus desired to provide an ultrasonic sensor capable of differentiation between entire adhesion of snow which absorbs ultrasonic waves, and partial adhesion of a foreign substance having a smaller influence.

An ultrasonic sensor according to an aspect of the present disclosure includes: a microphone that is comprised of a piezoelectric vibration element converting an electrical signal into a vibration and converting a vibration into an electrical signal; a microphone housing that accommodates the microphone, the microphone housing being formed in a bottomed tubular shape having a bottom constituting a vibration portion to which the microphone is attached and a side wall; and an adhesion sensor that detects adhesion of a foreign substance to a first surface of the bottom, wherein the adhesion sensor includes: a plurality of variable capacitances defined between a plurality of sensor electrodes disposed on the first surface of the bottom, each of the plurality of variable capacitances having a capacitance value which changes in response to adhesion of a foreign substance to the first surface; and an adhesion detection unit configured to measure an individual capacitance value which is a capacitance value of each of the plurality of variable capacitances and a total capacitance value which is a total of the capacitance values of all the plurality of variable capacitances to determine, based on the individual capacitance value and the total capacitance value, whether a foreign substance adheres to the first surface, and, when it is determined that a foreign substance adheres, specify a type of the foreign substance.

As described above, a plurality of sensor electrodes are disposed on the first surface of the bottom of the microphone housing to form a plurality of variable capacitances in the adhesion sensor. Thus, a change in capacitance of each variable capacitance is measured. Therefore, the adhesion detection area can be divided to specify the position of the adhering substance. Further, the type of the adhering substance is specified from the relationship between the total capacitance value of the plurality of variable capacitances and the respective capacitance values using the difference in relative dielectric constant corresponding to the type of the adhering substance. Accordingly, it is possible to specify whether the adhesion of the foreign substance is partial adhesion or entire adhesion, and specify the position and type of the adhering substance. Therefore, it is possible to provide an ultrasonic sensor capable of differentiation between entire adhesion of a foreign substance having a larger influence on the vibration properties of the vibration portion and partial adhesion of a foreign substance having a smaller influence on the vibration properties of the vibration portion.

The reference numerals in parenthesis attached to the components indicate an example corresponding relationship between the components and specific components described in the embodiments below.

With reference to the drawings, embodiments of the present disclosure will be described. In the description of the following embodiments, the same or equivalent components are denoted by the same reference numerals.

First Embodiment

Referring to FIGS. 1 to 6, a structure of an ultrasonic sensor 1 according to a first embodiment will be described. The ultrasonic sensor 1 according to the present embodiment is mounted on a vehicle. For example, as shown in FIG. 1, the ultrasonic sensor 1 may be mounted on a bumper B, which is a body part having a plate shape. The bumper B has a bumper outer surface B1 constituting the outer surface of the vehicle and a bumper inner surface B2 which is a rear surface thereof. Further, the bumper B has a mounting hole B3, which is a through hole through which the ultrasonic sensor 1 is mounted on the bumper B.

Figure 3:
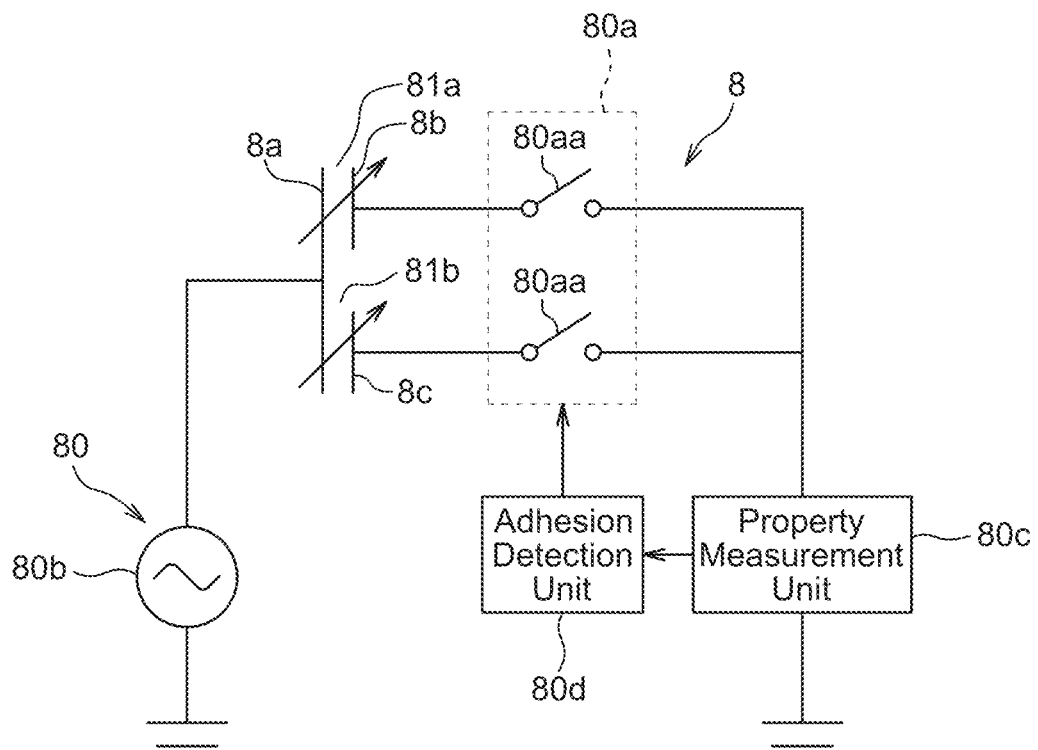
FIG. 3 is a circuit diagram of an adhesion sensor.

As shown in FIG. 1, the ultrasonic sensor 1 includes a microphone 2, a microphone housing 3, a cushion 4, a circuit board 5, a sensor case 6, a sensor connector 7, an adhesion sensor 8 shown in FIG. 3, and the like. The ultrasonic sensor 1 is mounted on the bumper B via a mounting component 11.

The microphone 2 is comprised of a piezoelectric vibration element, and constitutes an ultrasonic transducer as a sound emitting unit and a sound collecting unit in the ultrasonic sensor 1 by converting an electrical signal into a vibration and converting a vibration into an electrical signal. The microphone 2 includes a piezoelectric film 2a made of lead zirconate titanate (hereinafter, referred to as PZT), a positive electrode terminal 2b connected to a first surface of the piezoelectric film 2a, and a negative electrode terminal 2c connected to a second surface of the piezoelectric film 2a. A second surface side of the microphone 2 on which the negative electrode terminal 2c is disposed is bonded to the microphone housing 3.

Specifically, a first surface side of the microphone 2 on which the positive electrode terminal 2b is disposed faces away from the second surface side bonded to the microphone housing 3. Further, the negative electrode terminal 2c, disposed on the second surface of the piezoelectric film 2a, is folded back over the side surface of the piezoelectric film 2a to extend on the first surface side. Accordingly, the negative electrode terminal 2c is also disposed on the first surface, which is the same surface as that on which the positive electrode terminal 2b is disposed, while being insulated from the positive electrode terminal 2b. Therefore, even when the negative electrode terminal 2c on the second surface side of the microphone 2 is bonded to the microphone housing 3, electrical connection can be made on the first surface side of the microphone 2. Further, the positive electrode terminal 2b is electrically connected to a positive electrode pattern (not shown) provided on the circuit board 5 via a positive electrode wiring 9a, and the negative electrode terminal 2c is electrically connected to a negative electrode pattern (not shown) provided on the circuit board 5 via a negative electrode wiring 9b.

With this configuration, a voltage which serves as a driving signal can be applied to the microphone 2, that is, a rectangular wave voltage can be applied to the positive electrode terminal 2b to repeatedly generate a potential difference between the positive electrode terminal 2b and the negative electrode terminal 2c, thereby vibrating the microphone 2. Further, when the microphone 2 is displaced by external vibration, an electromotive force corresponding to the displacement can be generated as an output from the microphone 2. The application of the driving signal to the microphone 2 and the output of the electromotive force from the microphone 2 are performed via the positive electrode wiring 9a and the negative electrode wiring 9b connecting the microphone 2 and the circuit board 5.

Furthermore, in the present embodiment, the microphone 2 is bonded to the microphone housing 3 made of a conductor via a conductive adhesive or the like. Therefore, the negative electrode terminal 2c of the microphone 2 is electrically connected to the microphone housing 3, and the microphone housing 3 together with the negative electrode terminal 2c is connected to a ground potential point of the circuit board 5. Although the present embodiment has a structure in which the microphone housing 3 is connected to the ground potential point via the negative electrode terminal 2c and the negative electrode wiring 9b, the microphone housing 3 may not necessarily be electrically connected to the negative electrode terminal 2c. A ground wiring may also be directly connected to the microphone housing 3 so that the microphone housing 3 is connected to the ground potential point via the ground wiring.

The microphone housing 3 is configured to output vibration generated by the microphone 2 to the outside as an ultrasonic wave and to transmit an external vibration to the microphone 2. In the present embodiment, in which the microphone housing 3 is made of a conductor, the microphone housing 3 also serves as a shield against noise. The microphone housing 3 is comprised of a member formed in a bottomed cylinder shape having a bottom 3a and a side wall 3b. The space inside the microphone housing 3 provides an accommodation space, in which the microphone 2 is accommodated while being bonded to a center portion of the bottom 3a. The microphone housing 3 is disposed, with the bottom 3a directed to the bumper outer surface B1, and with the side wall 3b side, in other words, an opening of the microphone housing 3 directed to the bumper inner surface B2.

Figure 2:
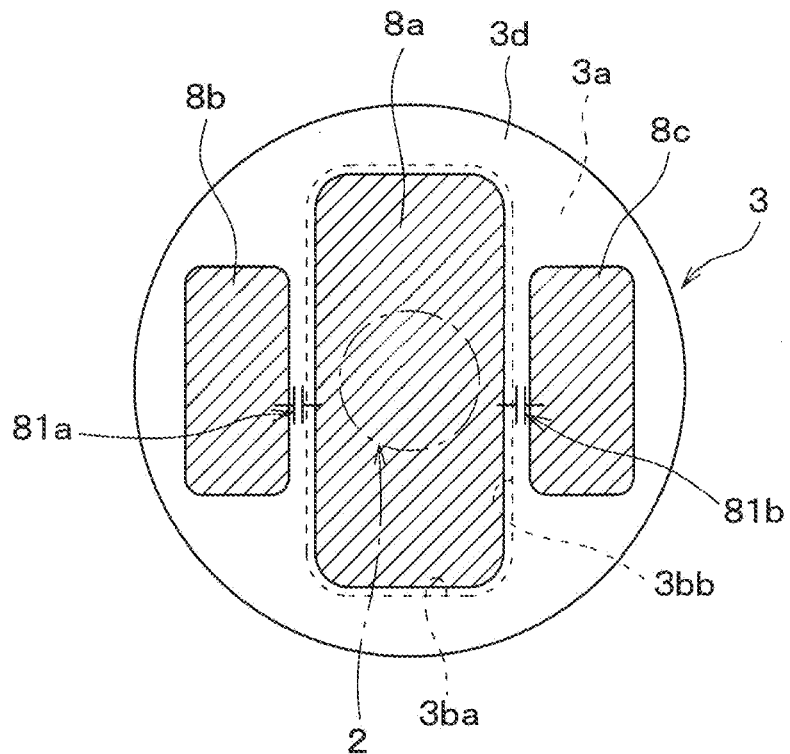
FIG. 2 is a view illustrating a structure of various electrodes provided in an adhesion sensor as viewed in a direction normal to a surface of a bottom of a microphone housing.

As indicated by the dotted line in FIG. 2, the accommodation space of the microphone housing 3 viewed in a direction normal to a first surface of the bottom 3a has a rectangular shape with rounded corners. A portion of the side wall 3b of the microphone housing 3 corresponding to the short side of the rectangular shape formed by the accommodation space is a thin wall portion 3ba, and a portion corresponding to the long side is a thick wall portion 3bb.

In the microphone housing 3 having the above configuration, the bottom 3a serves as a vibration portion to thereby transmit ultrasound waves. Specifically, when the microphone 2 is vibrated by a voltage being applied to the microphone 2 as a driving signal, the bottom 3a is vibrated accordingly. Due to these behaviors, the bottom 3a of the microphone housing 3 is subjected to ultrasonic vibration. The ultrasound wave is transmitted with a directional axis in a direction normal to the first surface of the bottom 3a, the first surface of the bottom 3a being the exposed surface of the bottom 3a.

When a reflected wave of the transmitted ultrasonic wave returns to the microphone housing 3, the bottom 3a is vibrated accordingly, and the vibration is transmitted to the microphone 2 bonded to the bottom portion 3a. As an electromotive force corresponding to the transmitted vibration is generated as an output from the microphone 2, the ultrasonic sensor 1 can detect reception of the reflected wave based on the electromotive force.

As described above, the microphone housing 3 of the present embodiment is made of a conductor. Examples of the conductor material include aluminum, a conductive polymer, or metal filler solidified with a resin, and the like. The microphone housing 3 is electrically connected to a GND (ground) pattern (not shown), which is a ground potential point in the circuit board 5 via the negative electrode terminal 2c and the negative electrode wiring 9b.

Although not shown in the figure, the microphone housing 3 is filled with an anti-vibration material such as silicone rubber.

The cushion 4 has a cylindrical portion with a hollow in which the microphone housing 3 is fitted. In the present embodiment, the cushion 4 is formed in a bottomed cylinder shape. The hollow of the cushion 4 accommodates the microphone housing 3 together with the microphone 2 and the like. The cushion 4 serves as a buffer member made of an elastic material, suppressing transmission of vibration between the microphone housing 3 and the bumper B or between the microphone housing 3 and the sensor case 6. The cushion 4 is made of an insulating elastic material, such as silicone rubber. The bottom of the cushion 4 has a through hole 4a, through which the inside of the microphone housing 3 is open toward the circuit board 5.

The circuit board 5 is provided with components constituting a sensor circuit of the ultrasonic sensor 1. In addition to that the microphone 2 and the microphone housing 3 are electrically connected to the circuit board 5 via the wiring 9a and the wiring 9b, various electronic components not shown in FIG. 1 are mounted on the circuit board 5 to form a sensor circuit.

Specifically, the sensor circuit includes, in addition to the microphone 2, a transmission unit, a reception unit, a control unit, an adhesion detection unit 80 shown in FIG. 3, and the like. Various electronic components constituting the transmission unit, the reception unit, the control unit and the adhesion detection unit 80 are mounted on the circuit board 5. This sensor circuit detects an obstacle and adhesion of a foreign substance to the vibration portion of the microphone housing 3.

The transmission unit applies a voltage for driving ultrasonic waves as an electrical signal to the microphone 2 in response to a control signal from the control unit. This causes vibration of the microphone 2 and the bottom 3a of the microphone housing 3, transmitting an ultrasonic wave. The reception unit is comprised of an amplifier or the like that performs differential amplification, and converts a vibration transmitted to the microphone 2 via the microphone housing 3 into an electrical signal at the time of reception. The control unit controls transmission of ultrasonic waves from the transmission unit and reception of reflected waves from the reception unit. The adhesion detection unit 80 detects adhesion of a foreign substance, and constitutes the adhesion sensor 8 which is provided as a part of the sensor circuit. The details of the adhesion detection unit 80 and adhesion detection of a foreign substance will be specifically described later. Although the adhesion detection unit 80 is described as a component provided separately from the control unit, the adhesion detection unit 80 may also be provided in the control unit.

When an application such as automatic driving that requires obstacle detection is activated, for example, while the vehicle is traveling, the sensor circuit having the above configuration receives a command from the application and performs obstacle detection. That is, upon receiving a command from the application, the control unit controls the transmission unit to apply a predetermined voltage to the microphone 2 and transmit an ultrasonic wave. Further, when the ultrasonic wave is reflected by an obstacle and returns to the microphone 2, the vibration corresponding to the reflected wave is converted into an electric signal by the microphone 2 and is then received by the reception unit. Thus, the control unit performs obstacle detection such as determination of a distance from the vehicle to the obstacle using a time interval between the timing when the ultrasonic wave is transmitted from the transmission unit and the timing when the reflected wave is received by the reception unit, and transmits the detection result to the application.

Although the control unit is described as being included in the circuit board 5, the control unit may also be provided external to the ultrasonic sensor. For example, the control unit may be an electronic control unit (hereinafter, referred to as an ECU) provided external to the ultrasonic sensor for executing an application that requires obstacle detection, or an ECU that controls the ultrasonic sensor according to a command from the application. For example, examples of the ECU that controls the ultrasonic sensor include a sonar ECU. When the control unit is provided external to the ultrasonic sensor, the circuit board 5 includes an interface (hereinafter, referred to as an I/F) for communicating with the control unit. As the circuit board 5 receives a driving signal from the control unit via the I/F, the transmission unit, the reception unit and the adhesion detection unit 80 are driven. Then, the reception result from the reception unit and the detection result from the adhesion detection unit 80 are transmitted to the control unit.

The sensor case 6 is a hollow member constituting a casing of the ultrasonic sensor 1, and integrally formed of a hard insulating synthetic resin such as polybutylene terephthalate.

Specifically, the sensor case 6 includes a cylindrical portion 6a corresponding to a tubular portion, an accommodating portion 6b formed in a substantially rectangular shape, and a connector case 6c. The inside of the cylindrical portion 6a communicates with a hollow portion of the accommodating portion 6b. The microphone housing 3 to which the microphone 2 is bonded and the cushion 4 are fixed to the inside of the cylindrical portion 6a, while the wiring 9a and the wiring 9b are drawn into the accommodating portion 6b through the through hole 4a of the cushion 4. The circuit board 5 is disposed in the hollow portion of the accommodating portion 6b, and a first end of the sensor connector 7 is drawn out. The circuit board 5 is electrically connected to the wiring 9a and the wiring 9b in the accommodating portion 6b, and also electrically connected to the first end of the sensor connector 7. An end of the accommodating portion 6b on a side opposite to that connected to the cylindrical portion 6a is open, and the accommodating portion 6b is filled with a moisture-proof member 10 provided through the opening.

The connector case 6c is provided on one end of the sensor case 6, and a second end of the sensor connector 7 is exposed from the connector case 6c.

The sensor connector 7 is used for electrically connecting the ultrasonic sensor 1 to an external component. Although only one line is shown in the figure, a plurality of lines, for example, lines for voltage application, GND connection, output, and the like are provided. The first end of the sensor connector 7 is drawn into the accommodating portion 6b of the sensor case 6 for connection to the circuit board 5, while the second end is exposed from the connector case 6c. When an external connector (not shown) is connected to the connector case 6c, the second end of the sensor connector 7 exposed from the connector case 6c is connected to a terminal of the external connector such that the ultrasonic sensor 1 is electrically connected to the external component.

The adhesion sensor 8 detects adhesion of a foreign substance to the vibration portion, for example, snow adhesion. The adhesion sensor 8 has a circuit configuration shown in FIG. 3, and includes, in addition to the adhesion detection unit 80, a variable capacitance 81 comprised of a first variable capacitance 81a and a second variable capacitance 81b.

The first variable capacitance 81a and the second variable capacitance 81b are constituted by a first sensor electrode 8a, a second sensor electrode 8b and a third sensor electrode 8c. In the present embodiment, as shown in FIG. 2, the first sensor electrode 8a, the second sensor electrode 8b and the third sensor electrode 8c are arrayed in one direction.

When the microphone housing 3 is made of a conductor as in the present embodiment, the first sensor electrode 8a, the second sensor electrode 8b and the third sensor electrode 8c are disposed on an insulating layer 3c that covers a surface of the microphone housing 3. The insulating layer 3c is provided for electrically isolating the first sensor electrode 8a, the second sensor electrode 8b and the third sensor electrode 8c from the microphone housing 3. In the present embodiment, the insulating layer 3c covers an entire surface of the bottom 3a of the microphone housing 3. Furthermore, the peripheries of the first sensor electrode 8a, the second sensor electrode 8b and the third sensor electrode 8c are surrounded and protected by a protective layer 3d. In addition, although not shown, the first sensor electrode 8a, the second sensor electrode 8b and the third sensor electrode 8c are connected to a wiring portion provided on, for example, an outer wall of the microphone housing 3 so that a desired potential can be applied when the wiring portion is connected to the circuit board 5.

The first sensor electrode 8a is disposed on a first surface of the bottom 3a of the microphone housing 3. The arrangement position and the shape of the first sensor electrode 8a is not specifically limited. In the present embodiment, the first sensor electrode 8a is disposed on the vibration portion, and formed in a rectangular shape as with the vibration portion. The first sensor electrode 8a is disposed inside the periphery of the bottom 3a, coaxially with the center of the vibration portion of the bottom 3a.

The second sensor electrode 8b is also disposed on the first surface of the bottom 3a of the microphone housing 3. The arrangement position and the shape of the second sensor electrode 8b is not specifically limited. In the present embodiment, the second sensor electrode 8b is disposed in a region different from the vibration portion, that is, on the outer edge side of the first surface of the bottom 3a, and has a rectangular shape. The second sensor electrode 8b is disposed with one side thereof facing one side of the first sensor electrode 8a. outside the vibration portion The third sensor electrode 8c is also disposed on the first surface of the bottom 3a of the microphone housing 3. The arrangement position and the shape of the third sensor electrode 8c is not specifically limited. In the present embodiment, the third sensor electrode 8c is disposed in a region different from the vibration portion, that is, on the outer edge side of the first surface of the bottom 3a and at a position on the opposite side of the first sensor electrode 8a than the second sensor electrode 8b is, and has a rectangular shape. The third sensor electrode 8c is disposed with one side thereof facing one side of the first sensor electrode 8a.

In this structure, the first variable capacitance 81a is constituted by the first sensor electrode 8a, the second sensor electrode 8b and the insulating layer 3c, while the second variable capacitance 81b is constituted by the first sensor electrode 8a, the third sensor electrode 8c and the insulating layer 3c. As shown in FIG. 3, the first variable capacitance 81a and the second variable capacitance 81b, which are connected in parallel to each other, are connected to the adhesion detection unit 80.

The adhesion detection unit 80 is provided on the circuit board 5 as a part of the sensor circuit. In adhesion detection, the adhesion detection unit 80 supplies an AC signal as a sensing current through the current path to the first variable capacitance 81a or the second variable capacitance 81b in sequence as shown in FIG. 3. Then, the adhesion detection unit 80 calculates the capacitance values of the first variable capacitance 81a and the second variable capacitance 81b to detect whether a foreign substance adheres and how it adheres.

Specifically, the adhesion detection unit 80 includes a switch control unit 80a, a current supply unit 80b, a property measurement unit 80c and the adhesion determination unit 80d. The switch control unit 80a includes the number of switches corresponding to the number of variable capacitances. In the present embodiment, a first switch 80aa and a second switch 80ab are provided. The switch control unit 80a controls to turn on/off each switch in response to a control signal from the adhesion determination unit 80d. The current supply unit 80b applies a predetermined voltage in adhesion detection to thereby supply an AC signal as a sensing current to the first variable capacitance 81a or the second variable capacitance 81b. The property measurement unit 80c measures capacitance values of the first variable capacitance 81a and the second variable capacitance 81b when the sensing current is supplied. The adhesion determination unit 80d detects whether a foreign substance adheres and how it adheres according to the measurement result from the property measurement unit 80c. The adhesion determination unit 80d determines the type of the foreign substance, for example, whether the foreign substance is water or snow, and whether the foreign substance partially or entirely adheres. Further, in adhesion detection, the adhesion determination unit 80d determines the variable capacitance whose capacitance value is to be measured, and outputs a corresponding control signal to the switch control unit 80a. Accordingly, the switch corresponding to the variable capacitance whose capacitance value is to be measured is turned on in sequence. Consequently, the variable capacitance to which a sensing current is supplied is switched so that the capacitance value of a desired variable capacitance is measured.

The mounting component 11 is a component constituting a retainer that firmly fixes the ultrasonic sensor 1 to the bumper B and a bezel as a design exposed on the bumper outer surface B1. The mounting component 11 is made of a resin or the like. In the present embodiment, the mounting component 11 includes a cylindrical portion 11a, a flange 11b and a stopper 11c.

The cylindrical portion 11a is a portion in which the cylindrical portion 6a of the sensor case 6, the microphone housing 3, and the like are fitted. The cylindrical portion 6a, the microphone housing 3, and the like are filled in a hollow of the cylindrical portion 11a such that the ultrasonic sensor 1 is held by the mounting component 11. The flange 11b is a portion disposed on one end of the cylindrical portion 11a and extends radially outward from the cylindrical portion 11a. An outer surface of the flange 11b constitutes a bezel as a design exposed on the bumper outer surface B1. The stopper 11c is formed on an side surface of the cylindrical portion 11a at a position separated from the flange 11b by a predetermined distance. A resin portion of the bumper B is fitted in between the stopper 11c and an inner surface of the flange 11b such that the mounting component 11 is firmly fixed to the bumper B, and thus the ultrasonic sensor 1 is mounted on the bumper B.

As described above, the ultrasonic sensor 1 according to the present embodiment having the above configuration is mounted on the bumper B via the mounting component 11. The ultrasonic sensor 1 having the above configuration performs obstacle detection. For example, as described above, when a command from an application that requires obstacle detection is input to the circuit board 5, the control unit controls the transmission unit to transmit an ultrasonic wave and the reception unit to receive a reflected wave of the transmitted ultrasonic wave. Further, the adhesion sensor 8 performs adhesion detection of a foreign substance, for example, when a start switch such as an ignition switch of a vehicle is turned on at a timing when the ultrasonic sensor 1 does not perform obstacle detection, that is, when the microphone 2 does not perform ultrasonic vibration.

Figure 4:
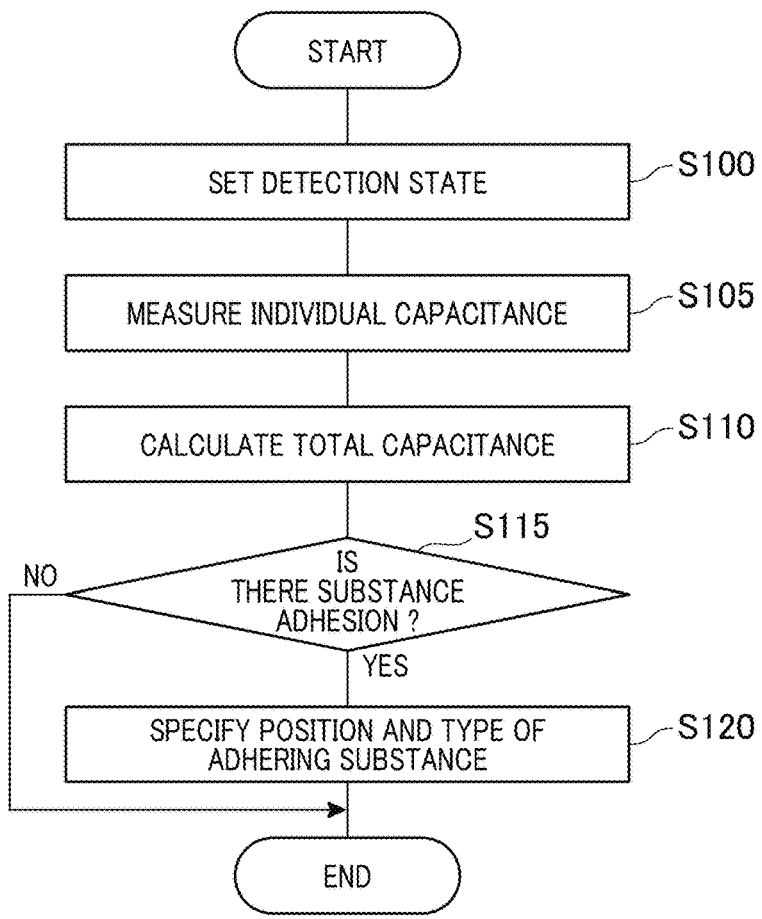
FIG. 4 is a flowchart of adhesion detection procedure.

Referring to a flowchart of adhesion detection shown in FIG. 4, the procedure of adhesion detection will be described. The procedure shown in FIG. 4 is executed by the adhesion detection unit 80 at a predetermined control cycle after the start switch of the vehicle is turned on.

First, in step S100, detection state setting is performed at a timing of adhesion detection. In detection state setting, a state suitable for adhesion detection is set. Specifically, a state is set in which obstacle detection is not performed and a vibration portion is not vibrated, preferably a state in which a vehicle is at rest and not affected by vibration due to the travelling of the vehicle. A state immediately after a start switch of the vehicle is turned on is suitable for adhesion detection.

Next, in step S105, an individual capacitance value is measured. In individual capacitance measurement, a capacitance value of the first variable capacitance 81a and a capacitance value of the second variable capacitance 81b are individually measured as individual capacitance values. For example, first, with the first switch 80aa turned on and the second switch 80ab turned off, a sensing current is supplied from the current supply unit 80b to the first variable capacitance 81a, and a capacitance value of the first variable capacitance 81a is measured by the property measurement unit 80c. Then, with the first switch 80aa turned off and the second switch 80ab turned on, a sensing current is supplied from the current supply unit 80b to the second variable capacitance 81b, and a capacitance value of the second variable capacitance 81b is measured by the property measurement unit 80c. Thus, the capacitance values of the first variable capacitance 81a and the second variable capacitance 81b are measured.

Subsequently, in step S110, a total capacitance value is calculated. In total capacitance calculation, a capacitance value of the entire circuit, in this case, a total capacitance value of the first variable capacitance 81a and the second variable capacitance 81b is calculated. For example, the capacitance value of the first variable capacitance 81a and the capacitance value of the second variable capacitance 81b individually measured in step S105 are added up to obtain a total capacitance value. Alternatively, with both the first switch 80aa and the second switch 80ab turned on, a sensing current is supplied from the current supply unit 80b to the first variable capacitance 81a and the second variable capacitance 81b. Thus, a total capacitance in a state in which the first variable capacitance 81a and the second variable capacitance 81b are connected in parallel may also be calculated by the property measurement unit 80c.

In step S115, it is determined whether there is adhering substance. If the determination is affirmative, the process proceeds to step S120 to specify the position and type of the adhering substance. The above determination is performed based on the results of steps S105 and S110.

When there is adhesion of a foreign substance, the total capacitance value changes due to a change in capacitance values of the first variable capacitance 81a and the second variable capacitance 81b. Thus, adhesion of a foreign substance can be detected by checking the total capacitance value. However, as described above, since partial adhesion of water has a small influence on obstacle detection, it is not preferred that obstacle detection is interrupted when adhesion of a foreign substance is detected.

In step S115, first, whether there is adhering substance is determined based on a change in total capacitance value. In either case of partial adhesion or entire adhesion, the total capacitance value changes in response to adhering substance, compared with a case having no adhesion. Therefore, a threshold for determining adhering substance is set, for example, based on a designed value or electrical properties of each part of the ultrasonic sensor, a resistance, an electrostatic capacitance, an impedance, or the like of each part constituting the circuit of the adhesion sensor 8. When the total capacitance value is greater than the threshold, it is determined that there is adhering substance.

Then, if the determination is affirmative in step S115, the process proceeds to step S120 to specify the position and type of the adhering substance based on the measurement result of the respective capacitance values of the first variable capacitance 81a and the second variable capacitance 81b obtained in step S110.

In the case of partial adhesion and when the foreign substance adheres to a position where the first variable capacitance 81a is disposed, the capacitance value of the first variable capacitance 81a changes, whereas the capacitance value of the second variable capacitance 81b does not substantially change. In the case of entire adhesion in which the foreign substance adheres to both positions where the first variable capacitance 81a and the second variable capacitance 81b are disposed, both the capacitance values of the first variable capacitance 81a and the second variable capacitance 81b change similarly. Therefore, it is possible to specify whether the adhesion is partial adhesion or entire adhesion by comparison between the capacitance values of the first variable capacitance 81a and the second variable capacitance 81b, for example, by determining a difference between these values.

Meanwhile, since the relative dielectric constant is different depending on the type of adhering substance, the total capacitance value in the case of entire adhesion is different between snow adhesion and water adhesion. Further, the total capacitance values in the case of entire adhesion of snow having a low relative dielectric constant and in the case of partial adhesion of water having a high relative dielectric constant are close to each other.

For this reason, after it is specified whether the adhesion is partial adhesion or entire adhesion by comparison between the capacitance values of the first variable capacitance 81a and the second variable capacitance 81b, the type of adhering substance is specified based on the magnitude of the total capacitance value. For example, in the case of entire adhesion, water adhesion is specified when the total capacitance is a large value, and snow adhesion is specified when the total capacitance is a small value. In the case of partial adhesion, water adhesion is specified when the total capacitance is a large value. Thus, the type of adhering substance can be specified.

Since the capacitance values of the first variable capacitance 81a and the second variable capacitance 81b are individually measured, it may also be possible to specify whether there is adhering substance and specify the position and type of the adhering substance directly based on the measurement results from the beginning. However, when the relative dielectric constant is small as in the case of snow adhesion, a difference between the capacitance values of the first variable capacitance 81a and the second variable capacitance 81b is small, which may cause a failure in accurate determination of whether there is adhering substance. For this reason, whether there is adhering substance is determined based on the total capacitance value, and, when adhering substance is found, the position and type of the adhering substance is specified using the respective capacitance values of the first variable capacitance 81a and the second variable capacitance 81b.

Figure 5:
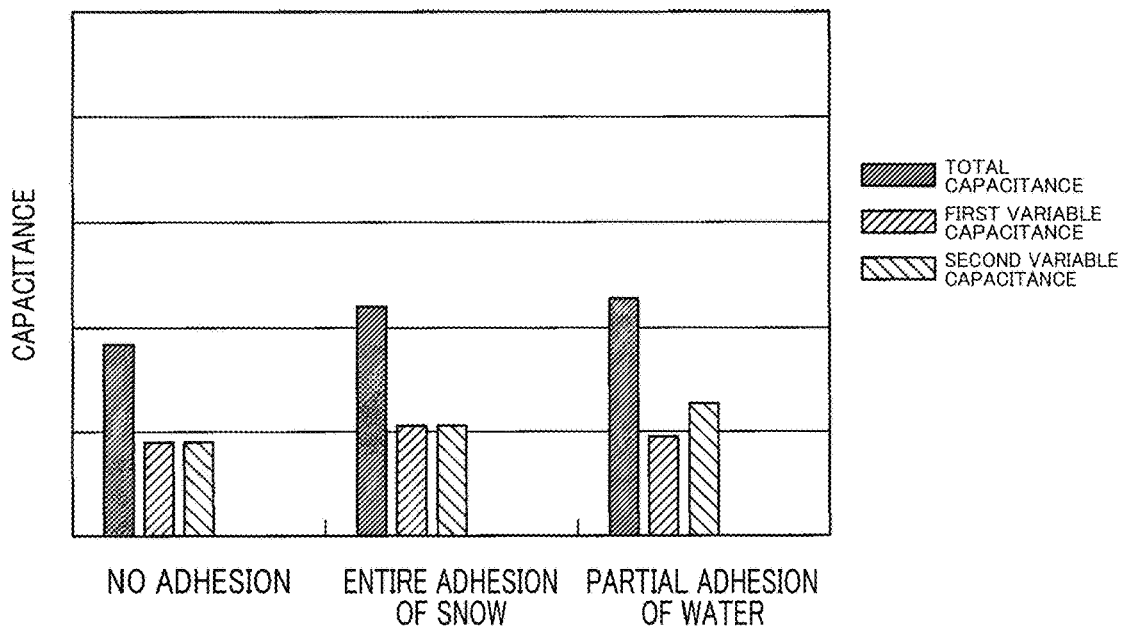
FIG. 5 is a diagram illustrating a total capacitance value and capacitance values of first and second variable capacitance for each of the case having no adhesion, the case having entire adhesion of snow, and the case having partial adhesion of water.

A simulation was performed for each of the case having no adhesion, the case having entire adhesion of snow, and the case having partial adhesion of water to measure a total capacitance value, and capacitance values of the first variable capacitance 81a and the second variable capacitance 81b. FIG. 5 shows the result of the simulation. As seen from the figure, in each of the cases of entire adhesion of snow and partial adhesion of water, the total capacitance value increases compared with the case of no adhesion. Further, in the case of entire adhesion of snow, the respective capacitance values of the first variable capacitance 81a and the second variable capacitance 81b similarly increase, but the amount of increase in each capacitance value is not significantly large. In the case of partial adhesion of water, the capacitance value of one of the first variable capacitance 81a and the second variable capacitance 81b to which water adheres significantly increases, whereas the capacitance value of the other does not substantially change.

As described above, although the total capacitance values are close to each other between the cases of entire adhesion of snow and partial adhesion of water, the respective capacitance values of the first variable capacitance 81a and the second variable capacitance 81b are different between these cases. Therefore, it is possible to specify whether the adhesion is partial adhesion or entire adhesion and the position and type of the adhering substance using the respective capacitance values of the first variable capacitance 81a and the second variable capacitance 81b.

As previously described, in the ultrasonic sensor of the present embodiment, a plurality of sensor electrodes are disposed on the first surface of the bottom 3a of the microphone housing 3 to form a plurality of variable capacitances in the adhesion sensor 8. Thus, a change in capacitance of each variable capacitance is measured. Therefore, the adhesion detection area can be divided to specify the position of the adhering substance. Further, the type of the adhering substance is specified from the relationship between the total capacitance value of the plurality of variable capacitances and the respective capacitance values using the difference in relative dielectric constant corresponding to the type of the adhering substance. Accordingly, it is possible to specify whether the adhesion of the foreign substance is partial adhesion or entire adhesion, and specify the position and type of the adhering substance. Therefore, it is possible to provide an ultrasonic sensor capable of differentiation between entire adhesion of a foreign substance having a large influence on the vibration properties of the vibration portion and partial adhesion of a foreign substance having a small influence on the vibration properties of the vibration portion.

Figure 6:
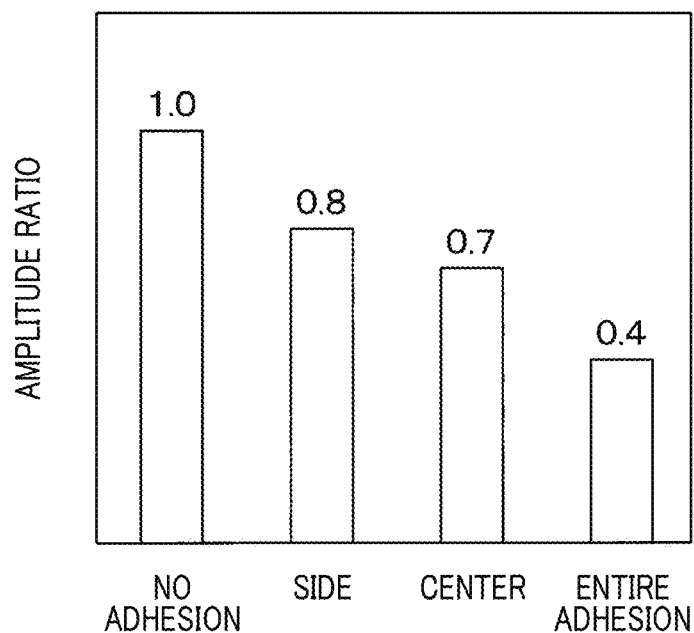
FIG. 6 is a diagram illustrating an amplitude ratio of the amplitude voltage for the case having no adhesion and the case having adhesion.

As a reference, the degree of influence was examined for each of the case having no adhesion on the surface of the microphone housing 3, the case having side adhesion in which snow adheres to a region half of the bottom 3a, the case having center adhesion in which snow adheres only to the vibration portion, and the case having entire adhesion. Specifically, the vibration portion was subjected to ultrasonic vibration to generate an ultrasonic wave. When receiving a reflected wave from an obstacle located at a predetermined distance from the ultrasonic sensor, the ultrasonic sensor measured an amplitude voltage based on the electromotive force. As a result, as shown in FIG. 6, when a maximum amplitude in the case of no adhesion was 1, the amplitude in the case of partial adhesion to a half region decreased to 0.8 times, the amplitude in the case of partial adhesion only to the vibration portion decreased to 0.7 times, and the amplitude in the case of entire adhesion significantly decreased to 0.4 times. Since the amplitude voltage in the case of entire adhesion of snow decreases by 50% or more compared with the case of no adhesion, it is particularly effective to detect entire adhesion of snow.

Although the description of the present embodiment has been given using snow and water as examples of the adhering substance, it should be noted that the same applies to mud or ice. That is, since the relative dielectric constant of mud and ice is close to that of snow, differentiation between entire adhesion of mud or ice and partial adhesion of water is difficult. However, according to the present embodiment, such differentiation can be easily performed. Further, it has been confirmed that differentiation between snow and mud or ice can be performed by examining the reverberation frequency. Accordingly, in addition to the technique of the present embodiment, a reverberation frequency can be used for differentiation between snow and mud or ice. Specifically, snow does not cause a change in reverberation frequency, whereas mud or ice cause a change in reverberation frequency. Accordingly, differentiation between snow and mud or ice can be performed.

Second Embodiment

A second embodiment will be described. In the present embodiment, a configuration of a plurality of variable capacitances is different from that in the first embodiment, and the other configurations are the same as those in the first embodiment. Accordingly, only the difference from the first embodiment will be described.

Figure 7:
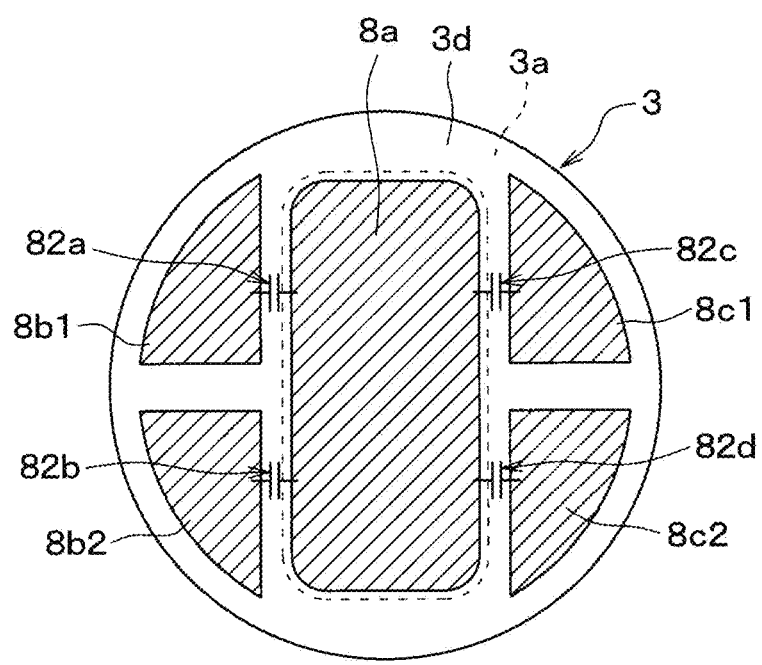
FIG. 7 is a view illustrating a structure of various electrodes provided in an adhesion sensor as viewed in a direction normal to a surface of a bottom of a microphone housing of an ultrasonic sensor according to a second embodiment.

As shown in FIG. 7, according to the present embodiment, four variable capacitances comprised of a first variable capacitance 82a to a fourth variable capacitance 82d are provided. Specifically, the second sensor electrode 8b described in the first embodiment is divided into a first electrode 8b1 and a second electrode 8b2, and the third sensor electrode 8c is divided into a first electrode 8c1 and a second electrode 8c2. That is, the first sensor electrode 8a, the first electrode 8b1 and the first electrode 8c1 are arrayed in a first direction, and the first sensor electrode 8a, the second electrode 8b2 and the second electrode 8c2 are also arrayed in the first direction and in parallel with the first sensor electrode 8a, the first electrode 8b1, and the first electrode 8c1. The first electrode 8b1 and the second electrode 8b2 are arrayed in a second direction perpendicular to the first direction, and the first electrode 8c1 and the second electrode 8c2 are also arrayed in the second direction and in parallel with the first electrode 8b1 and the second electrode 8b2.

Accordingly, a first variable capacitance 82a is formed between the first sensor electrode 8a and the first electrode 8b1, and a second variable capacitance 82b is formed between the first sensor electrode 8a and the second electrode 8b2. In addition, a third variable capacitance 82c is formed between the first sensor electrode 8a and the first electrode 8c1, and a fourth variable capacitance 82d is formed between the first sensor electrode 8a and the second electrode 8c2.

In detection of foreign substance adhesion with the above configuration, the first sensor electrode 8a may be set to, for example, 0 V potential, while the first electrode 8b1 and the second electrode 8b2 in the second sensor electrode 8b, and the first electrode 8c1 and the second electrode 8c2 in the third sensor electrode 8c may be sequentially set to a predetermined potential, for example, 5 V potential. Accordingly, the respective capacitance values of four variable capacitances comprised of the first variable capacitance 82a to the fourth variable capacitance 82d can be sequentially measured. Further, a total capacitance value of all the variable capacitances can be measured by adding up all the capacitance values of the respective variable capacitances, or by measuring the capacitance values with the first sensor electrode 8a set to a 0 V potential, for example, and the first electrode 8b1, the second electrode 8b2, the first electrode 8c1 and the second electrode 8c2 set to a 5 V potential, for example.

The number of variable capacitances is not specifically limited, and as in the present embodiment, four variable capacitances can be provided. With this configuration as well, the same effects as that in the first embodiment can be obtained.

Figure 8:
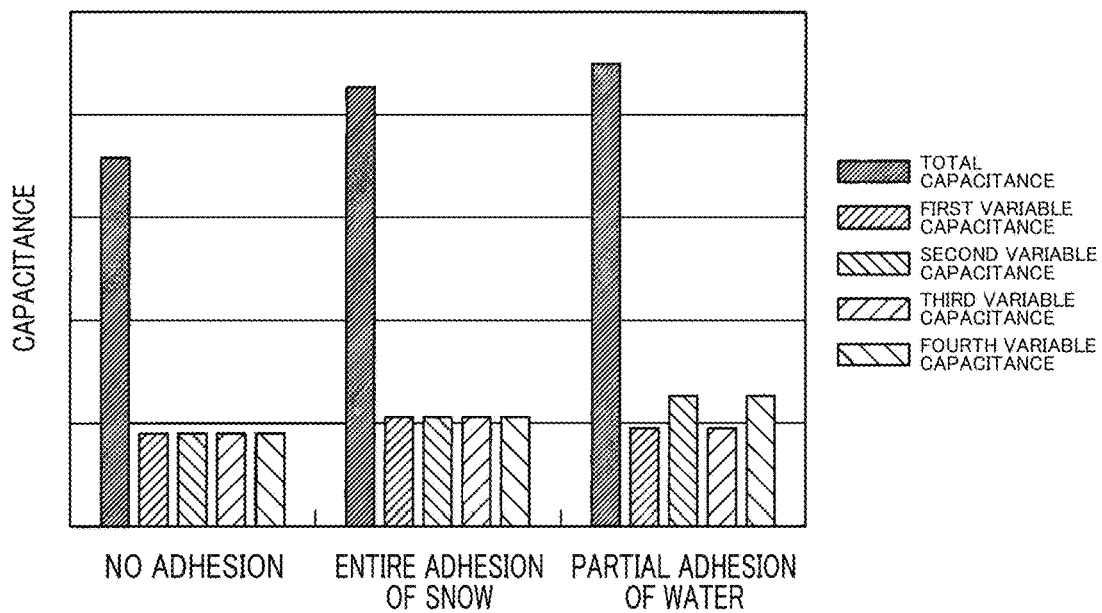
FIG. 8 is a diagram illustrating a total capacitance value and capacitance values of first to fourth variable capacitance for each of the case having no adhesion, the case having entire adhesion of snow, and the case having partial adhesion of water.

As a reference, a simulation was performed for each of the case having no adhesion, the case having entire adhesion of snow, and the case having partial adhesion of water to measure a total capacitance value, and capacitance values of the first to fourth variable capacitances 82a to 82d. In the case of partial adhesion of water, the position of adhesion was assumed to be between the second electrode 8b2 of the second sensor electrode 8b and the second electrode 8c2 of the third sensor electrode 8c. FIG. 8 shows the result of the simulation. As seen from the figure, in each of the cases of entire adhesion of snow and partial adhesion of water, the total capacitance value increases compared with the case of no adhesion. Further, in the case of entire adhesion of snow, the respective capacitance values of the first to fourth variable capacitances 82a to 82d similarly increase, but the amount of increase in each capacitance value is not significantly large. In the case of partial adhesion of water, the capacitance values of the second variable capacitance 82b and the fourth variable capacitance 82d to which water adheres significantly increase, whereas the capacitance values of the other variable capacitances to which water does not adhere do not substantially change. Thus, in the configuration having four variable capacitances, a change in capacitance value is similar to that in the first embodiment. Accordingly, adhesion of a foreign substance can be detected in the same manner as in the first embodiment. Further, with an increase in the number of variable capacitances, the adhesion detection area can be divided into more regions. Accordingly, the position of adhesion in the case of partial adhesion can be specified in more detail.

Third Embodiment

A third embodiment will be described. In the present embodiment, a configuration of a plurality of variable capacitances is different from that in the first embodiment, and the other configurations are the same as those in the first embodiment. Accordingly, only the difference from the first embodiment will be described.

Figure 9:
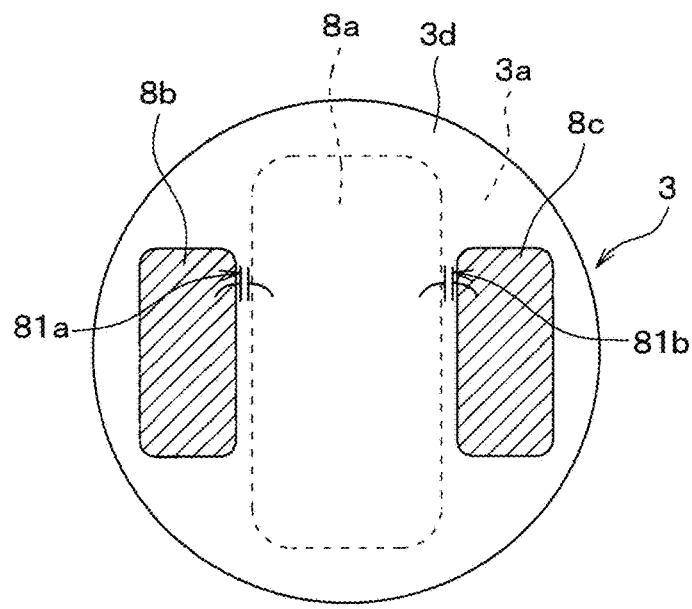
FIG. 9 is a view illustrating a structure of various electrodes provided in an adhesion sensor as viewed in a direction normal to a surface of a bottom of a microphone housing of an ultrasonic sensor according to a third embodiment.
Figure 10:
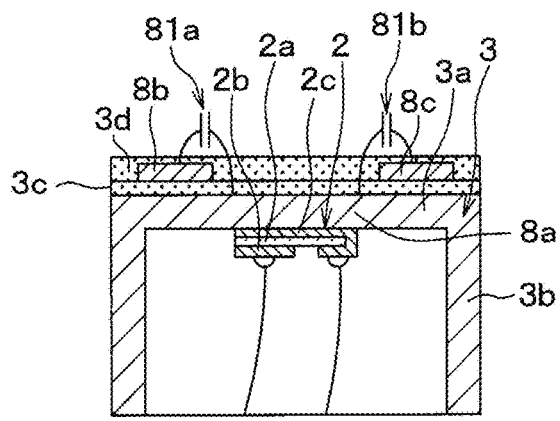
FIG. 10 is a cross-sectional view of FIG. 9 taken along the line extending in a horizontal direction in the drawing.

As shown in FIGS. 9 and 10, according to the present embodiment, the microphone housing 3 made of a conductor functions as the first sensor electrode 8a. The second sensor electrode 8b and the third sensor electrode 8c are provided on the bottom 3a with the insulating layer 3c interposed between each sensor electrode and the bottom 3a such that the first variable capacitance 81a and the second variable capacitance 81b are provided. The configuration of the second sensor electrode 8b and the third sensor electrode 8c is the same as that in the first embodiment.

In this configuration, the first variable capacitance 81a and the second variable capacitance 81b can be formed between the microphone housing 3 that functions as the first sensor electrode 8a and each of the second sensor electrode 8b and the third sensor electrode 8c, respectively, with a path extending from a surface of each electrode through the protective layer 3d and the insulating layer 3c as shown in FIG. 10. Accordingly, capacitance values of the first variable capacitance 81a and the second variable capacitance 81b formed between the microphone housing 3, which is a ground potential and functions as the first sensor electrode 8a, and each of the second sensor electrode 8b and the third sensor electrode 8c, respectively, are detected by supplying an AC signal as a sensing current to the second sensor electrode 8b and the third sensor electrode 8c. Thus, a change in capacitance of the first variable capacitance 81a and the second variable capacitance 81b due to foreign substance adhesion can be measured, and the same effects as that in the first embodiment can be obtained.

In addition, according to the present embodiment, both the second sensor electrode 8b and the third sensor electrode 8c formed on the bottom 3a can be located outside the vibration portion. Accordingly, influence on the vibration properties can be further reduced.

Fourth Embodiment

A fourth embodiment will be described. In the present embodiment, a change in capacitance can be detected in a more preferred manner than in the third embodiment, and the other configurations are the same as those in the third embodiment. Accordingly, only the difference from the third embodiment will be described.

With the configuration of the third embodiment, detection of foreign substance adhesion can be performed. However, since the second sensor electrode 8b and the third sensor electrode 8c are disposed immediately above the microphone housing 3, which is a ground potential, with the insulating layer 3c interposed therebetween, a parasitic capacitance is formed between each sensor electrode and the microphone housing 3, which may significantly affect the adhesion detection. That is, since only the insulating layer 3c is provided between each of the second sensor electrode 8b and the third sensor electrode 8c and the microphone housing 3, a capacitance value of the parasitic capacitance becomes large. Accordingly, a change in capacitance value of the parasitic capacitance affects the measurement of a change in capacitance of the first variable capacitance 81a and the second variable capacitance 81b.

Figure 11:
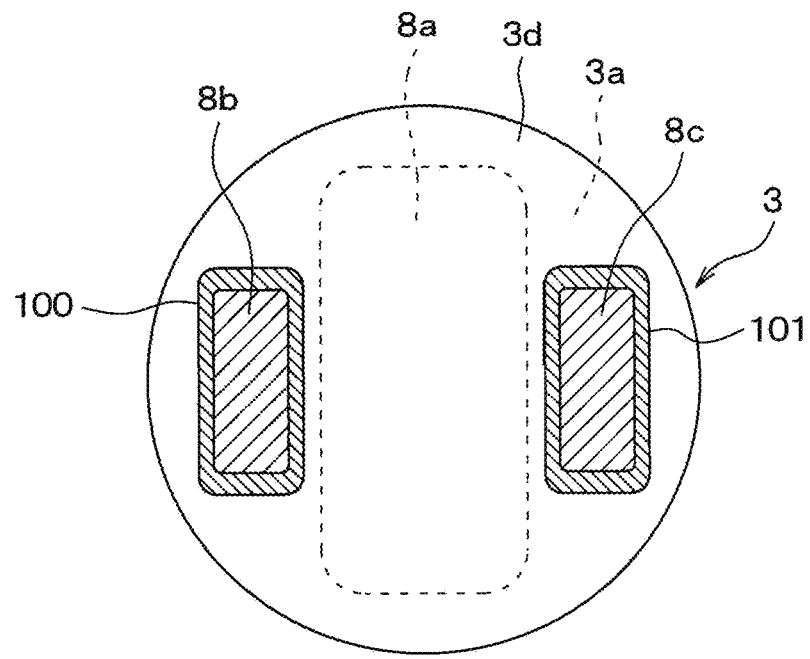
FIG. 11 is a view illustrating a structure of various electrodes provided in an adhesion sensor as viewed in a direction normal to a surface of a bottom of a microphone housing of an ultrasonic sensor according to a fourth embodiment.
Figure 12:
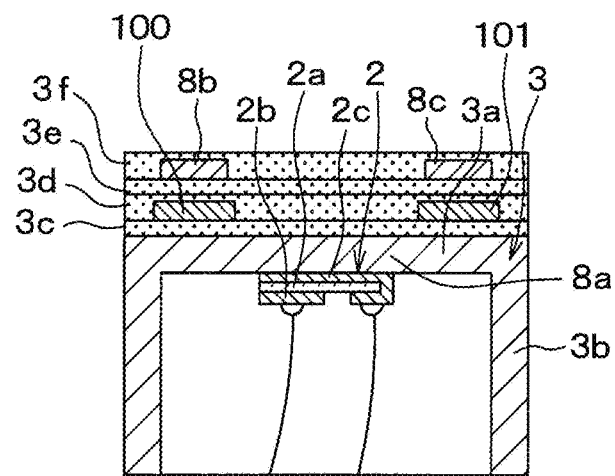
FIG. 12 is a cross-sectional view of FIG. 11 taken along the line extending in a horizontal direction in the drawing.

Therefore, according to the present embodiment, as shown in FIGS. 11 and 12, a first guard electrode 100 and a second guard electrode 101 are provided between the microphone housing 3 and each of the second sensor electrode 8b and the third sensor electrode 8c, respectively. Specifically, the first guard electrode 100 and the second guard electrode 101 are disposed on the insulating layer 3c, which is located on the microphone housing 3. Further, a protective layer 3d is provided on the insulating layer 3c while surrounding the peripheries of the first guard electrode 100 and the second guard electrode 101. Further, an insulating layer 3e is provided on the protective layer 3d. The second sensor electrode 8b and the third sensor electrode 8c are disposed on the insulating layer 3e. Further, the second sensor electrode 8b and the third sensor electrode 8c are covered with a protective layer 3f.

The first guard electrode 100 and the second guard electrode 101 are electrically connected to the circuit board 5 via a wiring portion or the like (not shown) so that a desired potential can be applied to them.

In detection of foreign substance adhesion with the above configuration, the second sensor electrode 8b and the first guard electrode 100 are set to the same potential, while the third sensor electrode 8c and the second guard electrode 101 are set to the same potential. Accordingly, the second sensor electrode 8b and the third sensor electrode 8c are prevented from being affected by the microphone housing 3 located immediately under the first guard electrode 100 and the second guard electrode 101, respectively, and a change in capacitance of the first variable capacitance 81a and the second variable capacitance 81b can be accurately measured. Thus, the accuracy in detection of foreign substance adhesion can be further improved. In addition, since only a change in capacitance of the first variable capacitance 81a and the second variable capacitance 81b can be measured, the accuracy in adhesion detection is further improved, and the detection range can also be expanded.

Fifth Embodiment

A fifth embodiment will be described. In the present embodiment, a configuration of the variable capacitances is different from that in the first embodiment, and the other configurations are the same as those in the first embodiment. Accordingly, only the difference from the first embodiment will be described.

Figure 13:
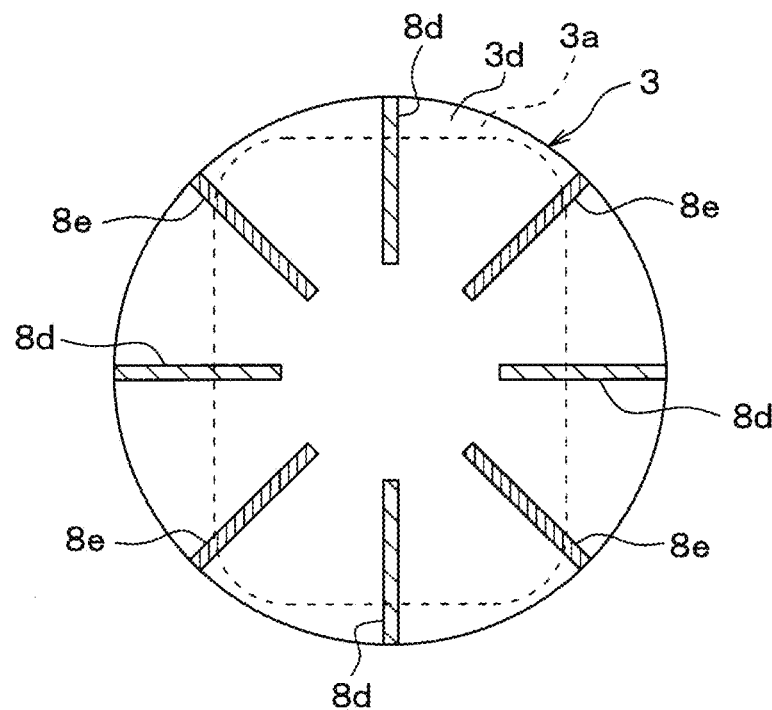
FIG. 13 is a view illustrating a structure of various electrodes provided in an adhesion sensor as viewed in a direction normal to a surface of a bottom of a microphone housing of an ultrasonic sensor according to a fifth embodiment.

As shown in FIG. 13, according to the present embodiment, first sensor electrodes 8d and second sensor electrodes 8e, each extending linearly radially outward, are alternately arranged along the outer edge of the bottom 3a of the microphone housing 3. The first sensor electrodes 8d and the second sensor electrodes 8e are alternately arranged at an equal angular interval in the circumferential direction in a radial layout. The first sensor electrodes 8d and the second sensor electrodes 8e are connected to a wiring portion provided along, for example, an outer wall of the microphone housing 3 so that a desired potential can be individually applied when the wiring portion is connected to the circuit board 5. Although the above example has been described using four first sensor electrodes 8d and four second sensor electrodes 8e arranged at an angular interval of 45°, the number of sensor electrodes is not limited thereto, and may be larger or smaller than the number used in the above description. Two or more variable capacitances can be constituted by arranging at least three sensor electrodes comprised of the first sensor electrode 8d and the second sensor electrode 8e, which are alternately arranged at a predetermined angular interval in a circumferential direction of the first surface of the bottom 3a.

In detection of foreign substance adhesion, the first sensor electrodes 8d as a first electrode group are applied with, for example, a 0 V potential, and the second sensor electrodes 8e as a second electrode group are applied with, for example, a 5 V potential. First, a capacitance value of a variable capacitance formed by a first pair comprised of the first sensor electrode 8d and the second sensor electrode 8e adjacent to each other is measured. Then, a capacitance value of another variable capacitance formed by a second pair comprised of one of the first pair, for example, the first sensor electrode 8d, and another second sensor electrode 8e adjacent to the first sensor electrode 8d of the first pair is measured. This operation is repeated for one round in a circumferential direction of the bottom 3a of the microphone housing 3 so that the capacitance values of the respective variable capacitances can be measured. Further, a total capacitance value of all the variable capacitances can be measured by adding up all the capacitance values of the respective variable capacitances, or by measuring the capacitance values with the first sensor electrodes 8d as the first electrode group set to a 0 V potential, for example, and the second sensor electrodes 8e as the second electrode group set to a 5 V potential, for example.

As described above, in the configuration in which a plurality of sensor electrodes are arranged in the circumferential direction of the bottom 3a, the same effects as that in the first embodiment can be obtained.

Sixth Embodiment

A sixth embodiment will be described. In the present embodiment, a configuration of the variable capacitances is different from that in the first embodiment, and the other configurations are the same as those in the first embodiment. Accordingly, only the difference from the first embodiment will be described.

Figure 14:
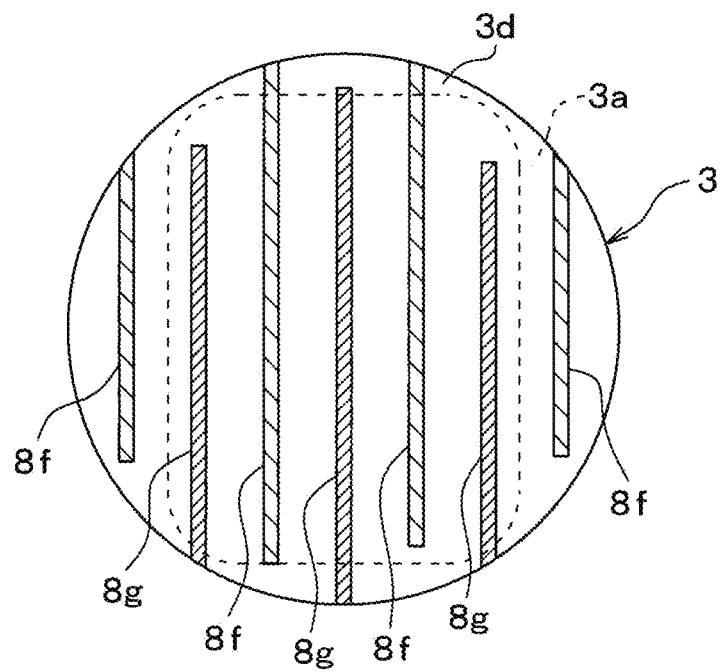
FIG. 14 is a view illustrating a structure of various electrodes provided in an adhesion sensor as viewed in a direction normal to a surface of a bottom of a microphone housing of an ultrasonic sensor according to a sixth embodiment.

As shown in FIG. 14, according to the present embodiment, first sensor electrodes 8f and second sensor electrodes 8g, each having a straight shape, are alternately arranged in parallel to each other at an equal interval. The first sensor electrodes 8f and the second sensor electrodes 8g are laid out in a comb-like pattern, in which one end of the first sensor electrodes 8f reaches the edge of the bottom 3a on one side of a line extending through the center line of the bottom 3a, that is, on the upper side in the drawing, and one end of the second sensor electrodes 8g reaches the edge of the bottom 3a on the other side of the line, that is, on the lower side in the drawing. Further, the first sensor electrodes 8f and the second sensor electrodes 8g are connected to a wiring portion provided along, for example, an outer wall of the microphone housing 3 so that a desired potential can be individually applied when the wiring portion is connected to the circuit board 5. Although the above example has been described using four first sensor electrodes 8f and three second sensor electrodes 8g, the number of sensor electrodes is not limited thereto, and may be larger or smaller than the number used in the above description. Two or more variable capacitances can be constituted by arranging at least three sensor electrodes comprised of the first sensor electrode 8f and the second sensor electrode 8g, which are alternately arranged and laid out in a comb-like pattern.

In detection of foreign substance adhesion, the first sensor electrodes 8f as a first electrode group are applied with, for example, a 0 V potential, and the second sensor electrodes 8g as a second electrode group are applied with, for example, a 5 V potential. First, a capacitance value of a variable capacitance formed by a first pair comprised of the first sensor electrode 8f and the second sensor electrode 8g adjacent to each other is measured. Then, a capacitance value of another variable capacitance formed by a second pair comprised of one of the first pair, for example, the first sensor electrode 8f, and another second sensor electrode 8g adjacent to the first sensor electrode 8f of the first pair is measured. This operation is repeated in sequence in a direction in which the first sensor electrodes 8f and the second sensor electrodes 8g are arranged so that the capacitance values of the respective variable capacitances can be measured. Further, a total capacitance value of all the variable capacitances can be measured by adding up all the capacitance values of the respective variable capacitances, or by measuring the capacitance values with the first sensor electrodes 8d as the first electrode group set to a 0 V potential, for example, and the second sensor electrodes 8e as the second electrode group set to a 5 V potential, for example.

As described above, in the configuration in which a plurality of sensor electrodes are arranged in a comb-like shape on the bottom 3a, the same effects as that in the first embodiment can be obtained.

Seventh Embodiment

A seventh embodiment will be described. In the present embodiment, a configuration of the variable capacitances is different from that in the first embodiment, and the other configurations are the same as those in the first embodiment. Accordingly, only the difference from the first embodiment will be described.

Figure 15:
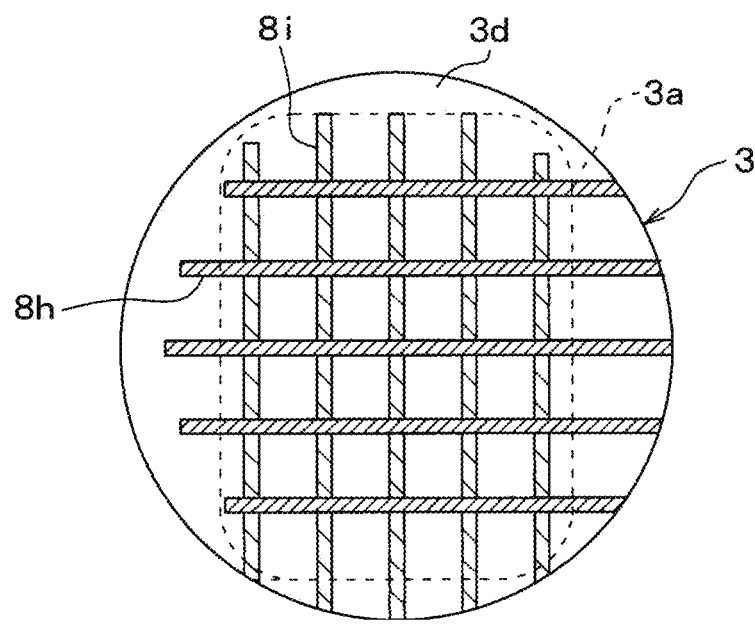
FIG. 15 is a view illustrating a structure of various electrodes provided in an adhesion sensor as viewed in a direction normal to a surface of a bottom of a microphone housing of an ultrasonic sensor according to a seventh embodiment.
Figure 16:
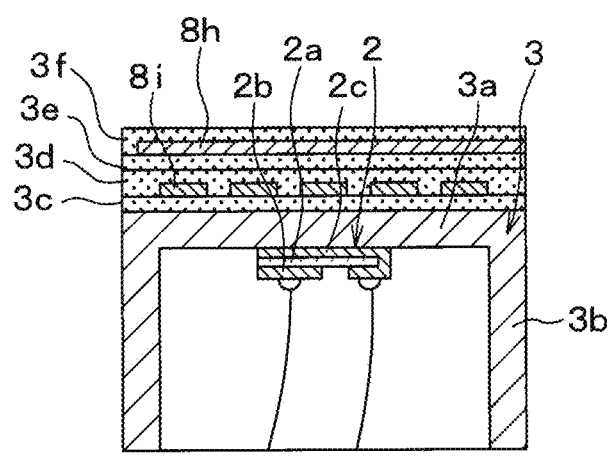
FIG. 16 is a cross-sectional view of FIG. 15 taken along the line extending in a horizontal direction in the drawing.

As shown in FIGS. 15 and 16, according to the present embodiment, first sensor electrodes 8h and second sensor electrodes 8i are arranged in a mesh pattern. Specifically, a plurality of first sensor electrodes 8h, each having a longitudinal direction in one direction, are arranged at an equal interval to form a stripe pattern. A plurality of second sensor electrodes 8i, each having a longitudinal direction in a direction intersecting with the longitudinal direction of the first sensor electrode 8h, in this case, a direction perpendicular to the longitudinal direction of the first sensor electrode 8h, are arranged at an equal interval to form a stripe pattern. Further, one end of the first sensor electrodes 8h and one end of the second sensor electrodes 8i reach the edge of the bottom 3a. The first sensor electrodes 8h and the second sensor electrodes 8i are connected to a wiring portion provided on, for example, an outer wall of the microphone housing 3 so that a desired potential can be individually applied when the wiring portion is connected to the circuit board 5.

Further, the insulating layer 3c is provided on the bottom 3a of the microphone housing 3. The second sensor electrodes 8i are disposed on the insulating layer 3c, and covered with the protective layer 3d and the insulating layer 3e. The first sensor electrodes 8h are disposed on the insulating layer 3e, and covered with the protective layer 3f.

Although the above example has been described using five first sensor electrodes 8h and five second sensor electrodes 8i, the number of sensor electrodes is not limited thereto, and may be larger or smaller than the number used in the above description.

In detection of foreign substance adhesion, the first sensor electrodes 8h as a first electrode group are applied with, for example, a 0 V potential, and the second sensor electrodes 8i as a second electrode group are applied with, for example, a 5 V potential. Then, one of the first sensor electrodes 8h and one of the second sensor electrodes 8i are selected and applied with a voltage, and a capacitance value of the variable capacitances formed at an intersection between the selected first sensor electrode 8h and the selected second sensor electrode 8i is measured. This operation is performed to all the combinations of the plurality of first sensor electrodes 8h and the plurality of second sensor electrodes 8i so that the capacitance values of the respective variable capacitances formed at all the intersections are measured in sequence. Further, a total capacitance value of all the variable capacitances can be measured by adding up all the capacitance values of the respective variable capacitances, or by measuring the capacitance values with the first sensor electrodes 8h as the first electrode group set to a 0 V potential, for example, and the second sensor electrodes 8i as the second electrode group set to a 5 V potential, for example.

As described above, in the configuration in which a plurality of sensor electrodes are arranged in a mesh form on the bottom 3a, the same effects as that in the first embodiment can be obtained.

Eighth Embodiment

An eighth embodiment will be described. In the present embodiment, a configuration of the variable capacitances is different from that in the first embodiment, and the other configurations are the same as those in the first embodiment. Accordingly, only the difference from the first embodiment will be described.

Figure 17:
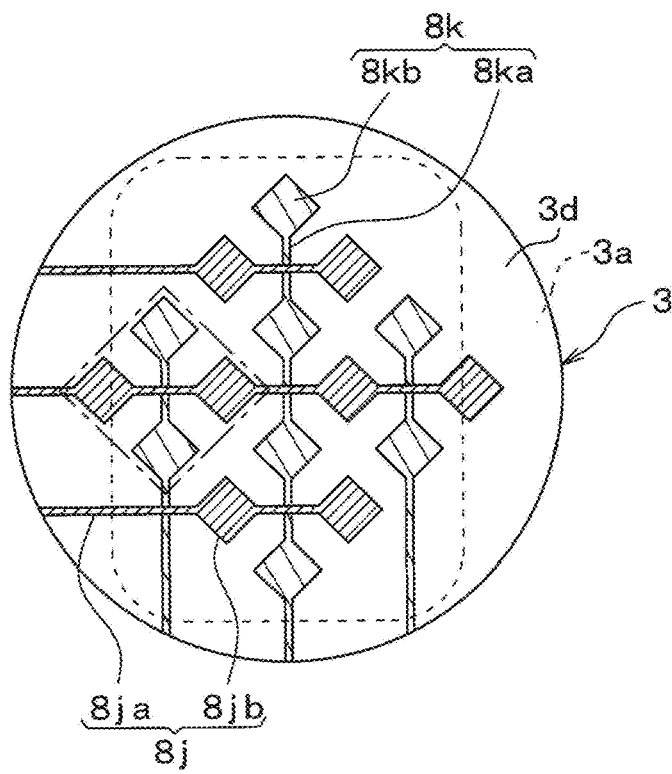
FIG. 17 is a view illustrating a structure of various electrodes provided in an adhesion sensor as viewed in a direction normal to a surface of a bottom of a microphone housing of an ultrasonic sensor according to an eighth embodiment.

As shown in FIG. 17, according to the present embodiment, a plurality of first sensor electrodes 8j and a plurality of second sensor electrodes 8k, each having a structure in which a plurality of rhombus-shaped electrodes are connected to each other via a line, are arranged orthogonal to each other such that the rhombus-shaped electrodes are arranged in a lattice pattern. Specifically, the first sensor electrode 8j includes a line 8ja having a longitudinal direction in one direction and rhombus-shaped electrodes 8jb. The rhombus-shaped electrodes 8jb are arranged at an equal interval, and one end of the line 8ja reaches the edge of the bottom 3a. Further, the second sensor electrode 8k includes a line 8ka having a longitudinal direction in a direction perpendicular to the line 8ja of the first sensor electrode 8j, and rhombus-shaped electrodes 8kb. The rhombus-shaped electrodes 8kb are arranged at an equal interval, and one end of the line 8ka reaches the edge of the bottom 3a. The lines 8ja and 8ka of the first sensor electrodes 8j and the second sensor electrodes 8k, respectively, are connected to a wiring portion provided on, for example, an outer wall of the microphone housing 3 so that a desired potential can be individually applied when the wiring portion is connected to the circuit board 5.

Although the above example has been described using three first sensor electrodes 8j and three second sensor electrodes 8k, the number of sensor electrodes is not limited thereto, and may be larger or smaller than the number used in the above description.

In this configuration, adjacent rhombus-shaped electrodes 8jb and rhombus-shaped electrodes 8kb are arranged facing each other, and variable capacitances are formed therebetween.

In detection of foreign substance adhesion, the first sensor electrodes 8j as a first electrode group are applied with, for example, a 0 V potential, and the second sensor electrodes 8k as a second electrode group are applied with, for example, a 5 V potential. Then, one of the first sensor electrodes 8j and one of the second sensor electrodes 8k are selected and applied with a voltage, and a capacitance value of the variable capacitance formed between the rhombus-shaped electrodes 8jb and the rhombus-shaped electrodes 8kb facing each other of the selected first sensor electrode 8j and the selected second sensor electrode 8k is measured. For example, when the first sensor electrode 8j at a center in the drawing and the second sensor electrode 8k on the left in the drawing are selected, a capacitance value of the variable capacitance constituted by four rhombus-shaped electrodes 8jb and 8kb, which are surrounded by the dotted and dashed line indicated in the figure, is measured. This operation is performed to all the combinations of the plurality of first sensor electrodes 8j and the plurality of second sensor electrodes 8k so that the capacitance values of the respective variable capacitances formed at all the positions are measured in sequence. Further, a total capacitance value of all the variable capacitances can be measured by adding up all the capacitance values of the respective variable capacitances, or by measuring the capacitance values with the first sensor electrodes 8j as the first electrode group set to a 0 V potential, for example, and the second sensor electrodes 8k as the second electrode group set to a 5 V potential, for example.

As described above, in the configuration in which the plurality of sensor electrodes 8j having the rhombus-shaped electrodes 8jb connected to each other and the plurality of sensor electrodes 8k having the rhombus-shaped electrodes 8kb connected to each other are disposed on the bottom 3a, the same effects as that in the first embodiment can be obtained.

Ninth Embodiment

A ninth embodiment will be described. In the present embodiment, a configuration of the variable capacitances is different from that in the first embodiment, and the other configurations are the same as those in the first embodiment. Accordingly, only the difference from the first embodiment will be described.

Figure 18:
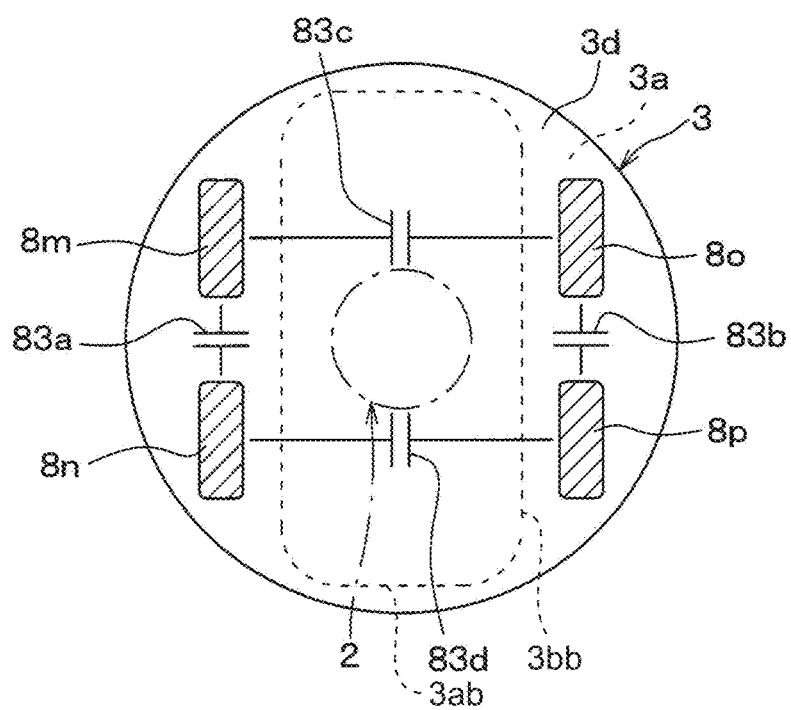
FIG. 18 is a view illustrating a structure of various electrodes provided in an adhesion sensor as viewed in a direction normal to a surface of a bottom of a microphone housing of an ultrasonic sensor according to a ninth embodiment.

As shown in FIG. 18, according to the present embodiment, a first sensor electrodes 8m to a fourth sensor electrode 8p are provided on the bottom 3a. The first sensor electrode 8m to the fourth sensor electrode 8p are arranged in a rectangular pattern, and in this case, all of them are disposed outside the vibration portion, that is, at positions corresponding to the thick wall portion 3bb. With this configuration, first to fourth variable capacitances 83a to 83d are formed between the adjacent sensor electrodes. Therefore, in detection of foreign substance adhesion, a voltage is applied to generate a potential difference between the adjacent sensor electrodes, and the capacitance values of the first variable capacitance 83a to the fourth variable capacitance 83d are measured. Thus, detection of foreign substance adhesion can be performed in the same manner as in the second embodiment.

In generation of a potential difference between the adjacent sensor electrodes, a potential difference may be generated between the sensor electrodes constituting a variable capacitance whose capacitance value is to be measured among the first variable capacitance 83*a* to the fourth variable capacitance 83*d*. For example, the first sensor electrode 8*m* may be set to a 5 V potential, and the second sensor electrode 8*n* may be set to a 0 V potential. However, the variable capacitances between the sensor electrodes located on both sides of the vibration portion, that is, the third variable capacitance 83*c* between the first sensor electrode 8*m* and the third sensor electrode 8*o*, and the fourth variable capacitance 83*d* between the second sensor electrode 8*n* and the fourth sensor electrode 8*p*, have a long distance between the electrodes and a small capacitance value. Accordingly, the third variable capacitance 83*c* and the fourth variable capacitance 83*d* may be regarded as one capacitor, and a combined capacitance value thereof may be measured with the first sensor electrode 8*m* and the second sensor electrode 8*n* set to a 5 V potential, and the third sensor electrode 8*o* and the fourth sensor electrode 8*p* set to a 0 V potential.

As described above, in the configuration in which the plurality of variable capacitances are formed between the plurality of sensor electrodes disposed on the bottom 3*a*, the plurality of sensor electrodes can be disposed outside the vibration portion to reduce influence on the vibration properties.

Tenth Embodiment

A tenth embodiment will be described. In the present embodiment, steps in the adhesion detection procedure are different from those in the first to ninth embodiments, and the other configurations are the same as those in the first to ninth embodiments. Accordingly, only the difference from the first to ninth embodiments will be described.

Figure 19:
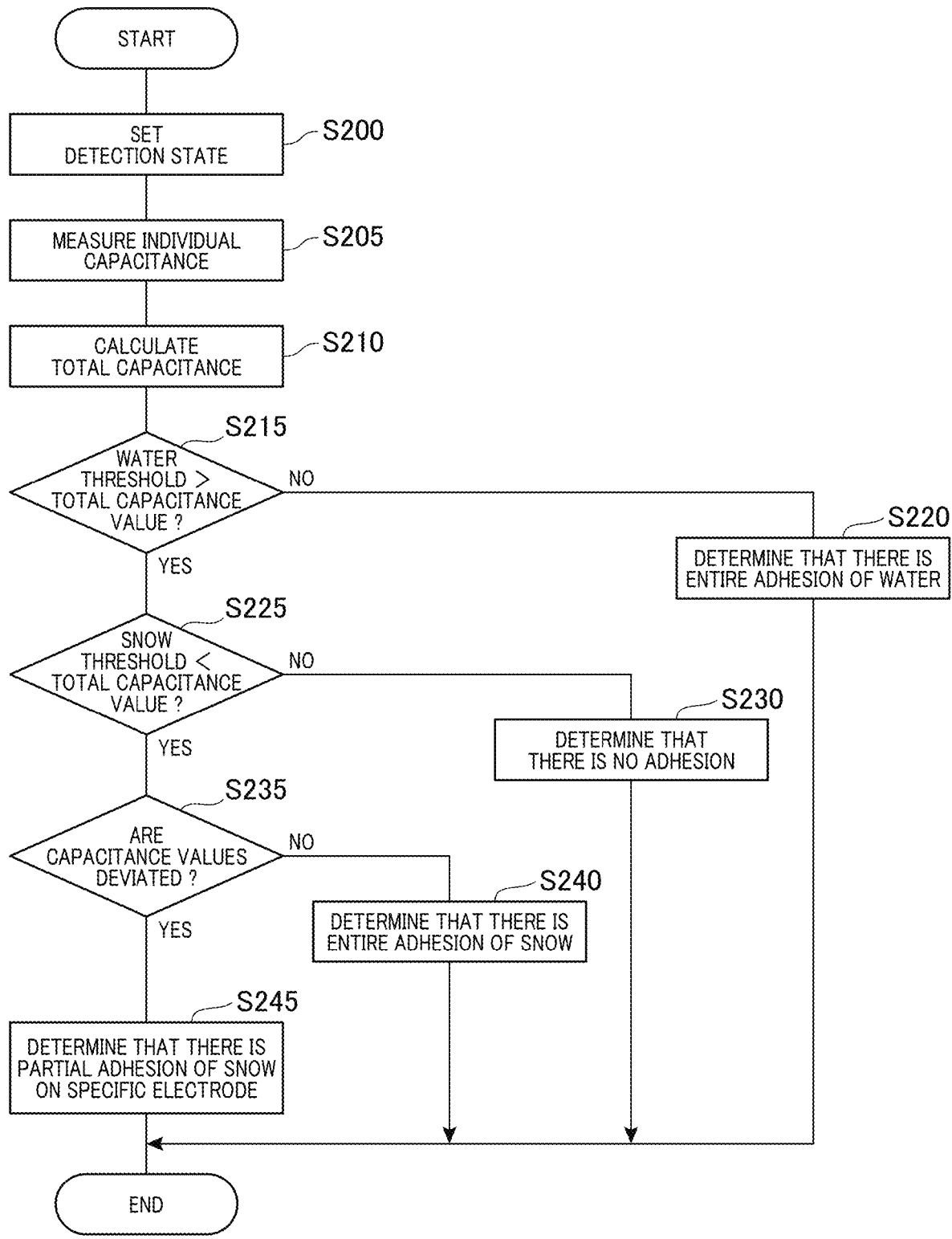
FIG. 19 is a flowchart of adhesion detection procedure of an ultrasonic sensor described in a tenth embodiment.

FIG. 19 shows a flowchart of adhesion detection procedure in the ultrasonic sensor according to the present embodiment. Referring to FIG. 19, the adhesion detection procedure according to the present embodiment will be described.

First, in steps S200 to S210, the same processing as in steps S100 to S110 of FIG. 4 is performed. Then, the process proceeds to step S215 to determine whether the total capacitance value calculated in step S210 is smaller than a water threshold which corresponds to a first threshold. The water threshold described herein is set based on a capacitance value assumed in the case of entire adhesion of water, and set to a value smaller than the assumed capacitance value. Here, it is desired to determine whether there is entire adhesion of water. Therefore, the water threshold is set to a value greater than the capacitance value assumed in the case of partial adhesion of water, entire adhesion of snow, or the like.

If the determination is negative in step S215, the process proceeds to step S220 where it is determined that there is entire adhesion of water, and the process ends. If the determination is affirmative, the process proceeds to step S225.

In step S225, it is determined whether the total capacitance value calculated in step S210 is greater than a snow threshold which corresponds to a second threshold. The snow threshold described herein is set based on a capacitance value assumed in the case of entire adhesion of snow, and set to a value smaller than the assumed capacitance value and smaller than the water threshold. Here, it is desired to determine there is no adhesion of foreign substance. Therefore, if there is a capacitance value assumed in the situation where the total capacitance value is smaller than the capacitance value in the case of entire adhesion of snow, the second threshold may also be set based on such a capacitance value.

If the determination is negative in step S225, the process proceeds to step S230 where it is determined that there is no adhesion of a foreign substance, and the process ends. If the determination is affirmative, the process proceeds to step S235.

In step S235, it is determined whether the capacitance values of the respective variable capacitances measured in step S205 are deviated from each other. For example, all the differences between the capacitance values of the respective variable capacitances are calculated. If the differences are greater than a deviation determination threshold, it is determined that the capacitance values of the respective variable capacitances are deviated from each other. If the determination is affirmative, the process proceeds to step S245, where it is determined that there is partial adhesion of snow on the sensor electrode constituting the variable capacitance having a higher capacitance value among the capacitance values of the respective variable capacitances, for example, a capacitance value higher than the mean value of all the capacitance values. Then, the process ends. If the determination is negative, the process proceeds to step S240 where it is determined that there is entire adhesion of snow, and the process ends.

As described above, it is possible to first determine, based on the total capacitance value, whether there is entire adhesion of water or no adhesion of a foreign substance, and then to specify that there is entire adhesion of snow, or the type and position of the adhering substance in the case of partial adhesion.

Eleventh Embodiment

An eleventh embodiment will be described. In the present embodiment, steps in the adhesion detection procedure are different from those in the first to ninth embodiments, and the other configurations are the same as those in the first to ninth embodiments. Accordingly, only the difference from the first to ninth embodiments will be described.

Figure 20:
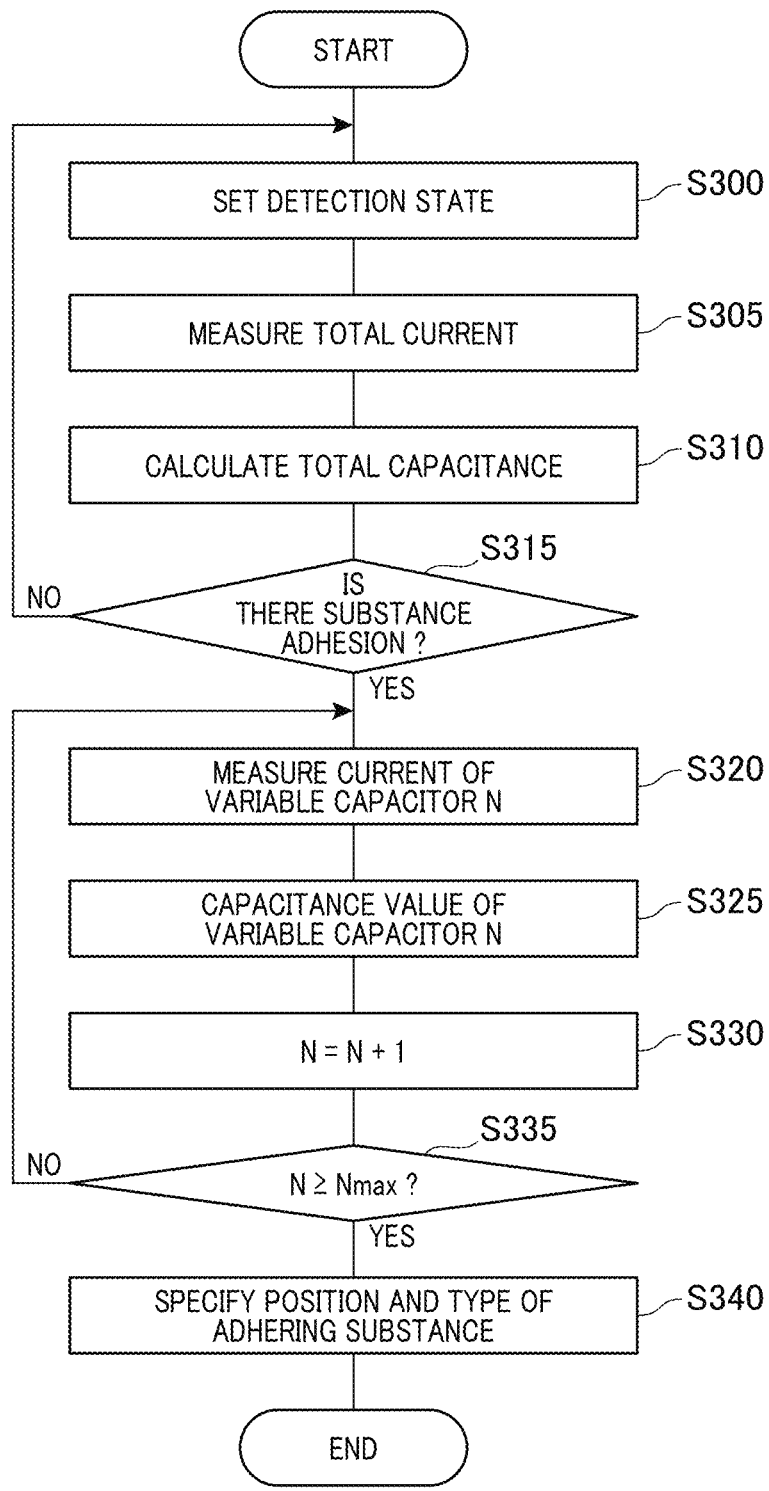
FIG. 20 is a flowchart of adhesion detection procedure of an ultrasonic sensor described in an eleventh embodiment.

FIG. 20 shows a flowchart of adhesion detection procedure in the ultrasonic sensor according to the present embodiment. Referring to FIG. 20, the adhesion detection procedure according to the present embodiment will be described.

First, in step S300, the same processing as in step S100 of FIG. 4 is performed. Then, in steps S305 and S310, a total capacitance value is calculated as in step S110 of FIG. 4 by supplying a sensing current to all the variable capacitances. In step S315, it is determined whether there is adhering substance as in step S115 of FIG. 4. If the determination is affirmative, the steps from step S320 onward are executed. If the determination is negative, the process ends.

In step S320, a predetermined potential is applied to each electrode, and a sensing current flowing through a sensor electrode constituting a variable capacitance N is measured to thereby measure a capacitance value of the variable capacitance N. The variable capacitance N described herein refers to the number of variable capacitances provided in the adhesion sensor 8 or a number given to each variable capacitance. N is 1 to 2 in the configuration of the first embodiment, and 1 to 4 in the configuration of the second embodiment. For example, in the configuration of the first embodiment, N is first set to 1, and a sensing current flowing through a sensor electrode constituting the first variable capacitance 81a is measured to thereby measure a capacitance value of the first variable capacitance 81a. Specifically, a sensing current flowing through the second sensor electrode 8b constituting the first variable capacitance 81a is measured with only the first switch 80aa turned on while the first sensor electrode 8a is set to a 0 V potential and the second sensor electrode 8b and the third sensor electrode 8c are set to a 5 V potential.

Subsequently, the process proceeds to step S325 where the capacitance value of the variable capacitance N is calculated based on the sensing current measured in step S320. Then, the process proceeds to step S330 where N is incremented by 1, and the process proceeds to step S335. Then, in step S335, it is determined whether N is Nmax or greater, in which Nmax is a maximum value of the number of the variable capacitances N, that is, 2 in the configuration of the first embodiment, and 4 in the configuration of the second embodiment.

If the determination is negative in step S335, the process proceeds to step S320, and a sensing current flowing through a sensor electrode constituting the next variable capacitance N is measured to thereby measure a capacitance value of the next variable capacitance N. Since N has been incremented by 1 in step S330, this variable capacitance N corresponds to the variable capacitance N+1, and the capacitance value thereof is measured. In the configuration of the first embodiment, N becomes 2 and a capacitance value of the second variable capacitance 81b is measured. Specifically, a sensing current flowing through the third sensor electrode 8c constituting the second variable capacitance 81b is measured with only the second switch 80ab turned on while the first sensor electrode 8a is set to a 0 V potential and the second sensor electrode 8b and the third sensor electrode 8c are set to a 5 V potential. Thus, the capacitance value of the second variable capacitance 81b is measured. When the capacitance values of all the variable capacitances N are measured in sequence, an affirmative determination is made in step S335. If the determination is affirmative in step S335, the process proceeds to step S340 where the same processing as in step S120 of FIG. 4 is performed to specify the position and type of the adhering substance.

As described above, whether there is adhering substance is first determined based on the total capacitance value of all the variable capacitances N, and, when adhering substance is found, the type and position of the adhering substance is specified by measuring the capacitance values of the respective variable capacitances N. With this configuration, specification of the type and position of the adhering substance is performed only when adhering substance is found. Therefore, adhesion detection procedure can be simplified.

Further, a sensing current may be supplied simultaneously to the respective variable capacitances N, or may be individually supplied to each variable capacitance. In the case where a sensing current is supplied simultaneously, measurement can be performed under the same noise condition. However, a plurality of property measurement units 80c having a number corresponding to the variable capacitances N are required to measure the capacitance values of the respective variable capacitances N. On the other hand, when a sensing current is individually supplied to each variable capacitance as in the present embodiment for measurement of the capacitance values of the respective variable capacitances N, it is possible to measure the capacitance value using a single property measurement unit 80c.

Modification of Eleventh Embodiment

In the above eleventh embodiment, a sensor electrode other than the sensor electrode constituting the variable capacitance N may also be set to a 0 V potential for measurement of the capacitance value.

Figure 21:
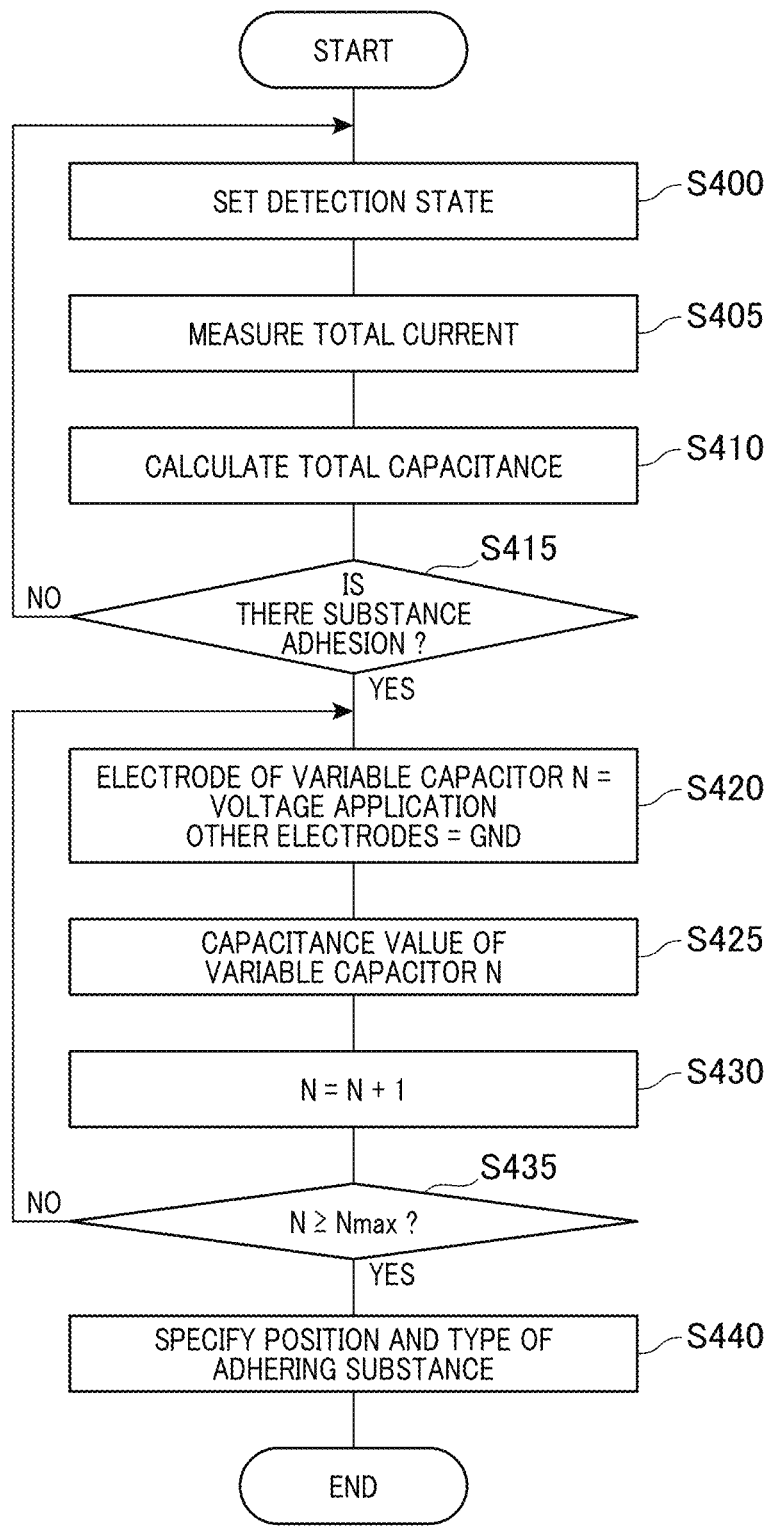
FIG. 21 is a flowchart of adhesion detection procedure of an ultrasonic sensor described in a twelfth embodiment.

In this case, a flowchart of adhesion detection procedure shown in FIG. 21 is executed. Specifically, in steps S400 to S415, the same processing as in steps S300 to S315 of FIG. 20 is performed. Then, in step S420, a predetermined voltage is applied to an electrode constituting the variable capacitance N, and the other electrodes are set to a GND potential. Then, a sensing current flowing through a sensor electrode constituting the variable capacitance N is measured to thereby measure a capacitance value of the variable capacitance N. The variable capacitance N described herein refers to the number of variable capacitances provided in the adhesion sensor 8 or a number given to each variable capacitance. N is 1 to 2 in the configuration of the first embodiment, and 1 to 4 in the configuration of the second embodiment. For example, in the configuration of the first embodiment, N is first set to 1, and a sensing current flowing through a sensor electrode constituting the first variable capacitance 81a is measured to thereby measure a capacitance value of the first variable capacitance 81a. Specifically, a sensing current flowing through the second sensor electrode 8b constituting the first variable capacitance 81a is measured while the first sensor electrode 8a and the third sensor electrode 8c are set to a 0 V potential and the second sensor electrode 8b is set to a 5 V potential.

Subsequently, the process proceeds to step S425 where the capacitance value of the variable capacitance N is calculated as in step S325 of FIG. 20. Then, in steps S430 and S435, the same processing as in steps S330 and S335 of FIG. 20 is performed. If the determination is negative in step S435, the process returns to step S420 to repeat the above procedure. Thus, the capacitance value of each variable capacitance N is measured.

As described above, a predetermined voltage may be applied to a sensor electrode constituting the variable capacitance N to be measured, and the other sensor electrodes may be set to a GND potential. Thus, the adhesion detection area can be changed by changing the applied voltage value.

Other Embodiments

The present disclosure has been described in accordance with the aforementioned embodiments, but is not limited to these embodiments. Various modifications and equivalent variations are also included. In addition, various combinations and forms, and other combinations and forms including only one element, one or more elements, or one or less elements are also within the scope and spirit of the present disclosure.

For example, the structure of the components constituting the ultrasonic sensor, such as the microphone 2, the microphone housing 3 and the sensor case 6, is merely an example and can be appropriately modified.

For example, the microphone housing 3 is made of a conductor having a bottomed cylinder shape. However, the microphone housing 3 may have any shape as long as it has a bottomed tubular shape, and may not necessarily be made of a conductor when the microphone housing 3 is not used as a part of a plurality of sensor electrodes, as in the first embodiment. It should be noted that the microphone housing 3 can be used as a part of a plurality of sensor electrodes in any structure shown in the above embodiments including the first embodiment. In this case, a guard electrode may be provided, as in the fourth embodiment, between the bottom 3a and the other sensor electrodes among the plurality of sensor electrodes disposed on the bottom 3a. Thus, the same effects as that in the fourth embodiment can be obtained.

Furthermore, the positions and the number of sensor electrodes are not specifically limited as long as a plurality of sensor electrodes are provided to form a plurality of variable capacitances. In this case, for example, the sensor electrodes may be arrayed in one direction as in the first embodiment or may be arrayed in a first direction and a direction perpendicular to the first direction as in the second embodiment.

Further, in measurement of the individual capacitance value, a different potential such as 0 V or 5 V is applied to each sensor electrode constituting the respective variable capacitances among a plurality of variable capacitances. However, this is merely an example. In the example described above, the individual capacitance values are measured using a single property measurement unit 80c. However, a plurality of property measurement units 80c having a number corresponding to the variable capacitances may also be provided so that the individual capacitance values are individually measured by the respective property measurement units 80c.

The above embodiments are not necessarily independent of each other, and may be appropriately combined to each other except for the cases where the combination is clearly impossible. For example, the sensor electrodes may be disposed outside the vibration portion as in the third embodiment while the sensor electrodes are laid out in a comb-like pattern as in the sixth embodiment, a mesh pattern as in the seventh embodiment, or in a structure having rhombus-shaped electrodes connected to each other as in the eighth embodiment. With these configurations, the same effects as that in the third embodiment can also be obtained.

Further, in the example described above, the bumper B is used as an example of the body part on which the ultrasonic sensor 1 is mounted. However, the ultrasonic sensor 1 can also be mounted on a body part other than the bumper B, such as a fender panel.

What is claimed is:

1. An ultrasonic sensor comprising:
   a microphone that is comprised of a piezoelectric vibration element converting an electrical signal into a vibration and converting a vibration into an electrical signal;
   a microphone housing that accommodates the microphone, the microphone housing being formed in a bottomed tubular shape having a bottom constituting a vibration portion to which the microphone is attached and a side wall; and
   an adhesion sensor that detects adhesion of a foreign substance to a first surface of the bottom, wherein the adhesion sensor includes:
      a plurality of variable capacitances defined between a plurality of sensor electrodes disposed on the first surface of the bottom, each of the plurality of variable capacitances having a capacitance value which changes in response to adhesion of a foreign substance to the first surface; and
      an adhesion detection unit configured to measure an individual capacitance value which is a capacitance value of each of the plurality of variable capacitances and a total capacitance value which is a total of the capacitance values of all the plurality of variable capacitances to determine, based on the individual capacitance value and the total capacitance value, whether a foreign substance adheres to the first surface, and, when it is determined that a foreign substance adheres, specify a type of the foreign substance.

2. The ultrasonic sensor according to claim 1, wherein the adhesion detection unit is configured to apply a different potential to each of the sensor electrodes that constitute each of the plurality of variable capacitances to thereby supply a sensing current to each of the plurality of variable capacitances for measurement of the individual capacitance value.

3. The ultrasonic sensor according to claim 1, wherein
   the adhesion detection unit is configured to include a plurality of property measurement units having a number corresponding to the plurality of variable capacitances, and
   the total capacitance value is measured by simultaneously measuring the individual capacitance values of the plurality of variable capacitances by the plurality of property measurement units.

4. The ultrasonic sensor according to claim 1, wherein
   the adhesion detection unit is configured to include a single property measurement unit, and
   the total capacitance value is measured by measuring a capacitance value of each of the plurality of variable capacitances one by one by the property measurement unit and adding up all the capacitance values of the plurality of variable capacitances.

5. The ultrasonic sensor according to claim 1, wherein the plurality of sensor electrodes are arrayed in a first direction on the first surface.

6. The ultrasonic sensor according to claim 1, wherein the plurality of sensor electrodes are arrayed in a first direction on the first surface and in a second direction perpendicular to the first direction on the first surface.

7. The ultrasonic sensor according to claim 1, wherein
   the plurality of sensor electrodes include a first sensor electrode and a second sensor electrode each having a straight shape, and
   at least three of the sensor electrodes comprised of the first sensor electrode and the second sensor electrode are alternately arranged and laid out in a comb-like pattern.

8. The ultrasonic sensor according to claim 1, wherein
   the plurality of sensor electrodes include a first sensor electrode and a second sensor electrode each having a straight shape, and
   the first sensor electrode and the second sensor electrode are alternately arranged at a predetermined angular interval in a circumferential direction on the first surface in a radial layout.

9. The ultrasonic sensor according to claim 1, wherein
   the plurality of sensor electrodes include:
      a plurality of first sensor electrodes each having a straight shape, the first sensor electrodes being arranged at an equal interval to form a stripe pattern; and
      a plurality of second sensor electrodes each having a straight shape, the second sensor electrodes being arranged at an equal interval to form a stripe pattern in a direction intersecting with the first sensor electrodes, and
   the first sensor electrodes are disposed on the second sensor electrodes with an insulating layer interposed therebetween, whereby the first sensor electrodes and the second sensor electrodes are arranged in a mesh pattern.

10. The ultrasonic sensor according to claim 1, wherein
the side wall of the microphone housing includes a thin wall portion and a thick wall portion having a thickness larger than that of the thin wall portion, and
the plurality of sensor electrodes are disposed only at positions corresponding to the thick wall portion of the side wall.

11. The ultrasonic sensor according to claim 1, wherein
the microphone housing is made of a conductor and connected to a ground potential point, and
the microphone housing constitutes a part of the plurality of sensor electrodes.

12. The ultrasonic sensor according to claim 11, wherein a guard electrode is provided between the bottom of the microphone housing and a particular sensor electrode-disposed on the bottom among the plurality of sensor electrodes, the guard electrode being set to a same potential as that of the particular sensor electrode disposed on the bottom among the plurality of sensor electrodes.

* * * * *